United States Patent [19]

Whiteside et al.

[11] 4,318,085

[45] Mar. 2, 1982

[54] METHOD AND APPARATUS FOR CONVERSION OF SIGNAL INFORMATION BETWEEN ANALOG AND DIGITAL FORMS

[75] Inventors: Arliss E. Whiteside, Royal Oak; William G. Wolber, Southfield, both of Mich.

[73] Assignee: The Bendix Corporation, Southfield, Mich.

[21] Appl. No.: 911,603

[22] Filed: Jun. 1, 1978

[51] Int. Cl.$^3$ .......................................... H03K 13/02
[52] U.S. Cl. ...................... 340/347 DA; 340/347 M; 340/347 CC
[58] Field of Search .... 340/347 M, 347 DA, 347 CC; 360/78

[56] References Cited

U.S. PATENT DOCUMENTS

| | | | |
|---|---|---|---|
| 3,216,001 | 11/1965 | Hinrichs | 340/347 AD |
| 3,217,147 | 11/1965 | Chapman | 340/347 DA X |
| 3,721,975 | 3/1973 | Brinkman et al. | 340/347 M |
| 3,735,392 | 5/1973 | Kaneko | 340/347 CC |
| 4,016,555 | 4/1977 | Tyrrel | 340/347 DA |
| 4,029,949 | 6/1977 | Dew | 340/347 DA X |
| 4,070,665 | 1/1978 | Glennon et al. | 340/347 CC X |
| 4,097,858 | 6/1978 | Stella et al. | 364/608 X |

FOREIGN PATENT DOCUMENTS 1299859  12/1972  United Kingdom .

OTHER PUBLICATIONS

The Engineering Staff of Analog Devices, Inc., Analog-Digital Conversion Handbook, 6/1972, pp. II-34 to II-38; I-64 & 65.
Analog Devices, Inc., Data Acquisition Products Catalog, 1978, pp. 303, 304.

Primary Examiner—Thomas J. Sloyan
Attorney, Agent, or Firm—James R. Ignatowski; Russel C. Wells

[57] ABSTRACT

Signal information is converted between analog and digital form in a two-step process employing conversion apparatus having stable, but not necessarily highly accurate components. The component tolerances on such conversion apparatus are much greater than those on such conversion apparatus are much greater than those normally allowed on conventional conversion apparatus of equal accuracy. In an A/D conversion, an analog signal is first converted into an (n+m)-bit digital word in a special purpose digital code unique to the specific A/D conversion apparatus. The (n+m)-bit word is then translated into an n-bit word in binary digital code in accordance with a predetermined relationship therebetween. In a D/A conversion, an n-bit digital word in a binary digital code is first translated into a corresponding (n+m)-bit digital word in the special purpose digital code. The (n+m)-bit word is then converted into an equivalent analog signal; the latter step being performed by a conversion apparatus unique to the special purpose digital code. A plurality of A/D and D/A converters suitable for use with the present invention are disclosed. A number of converter calibration techniques are also disclosed.

20 Claims, 23 Drawing Figures

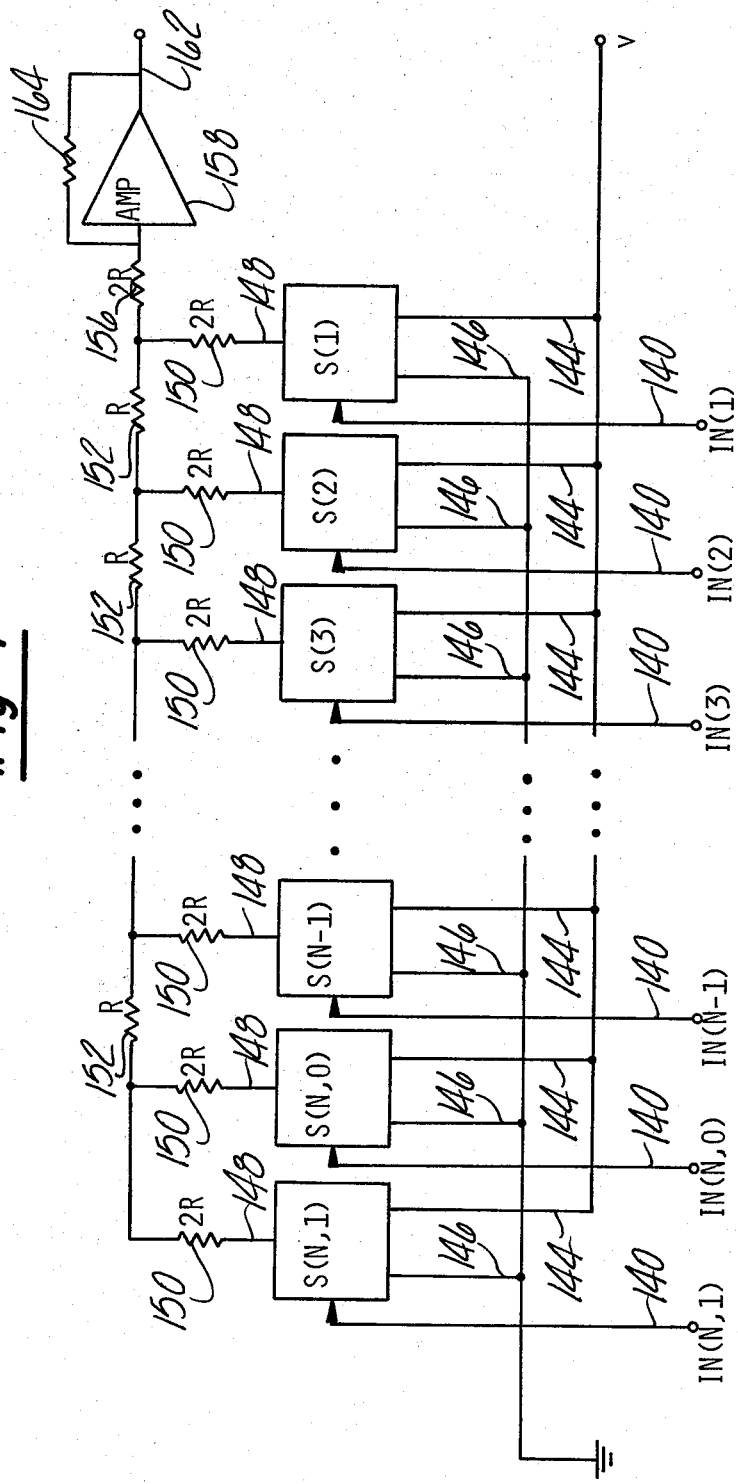

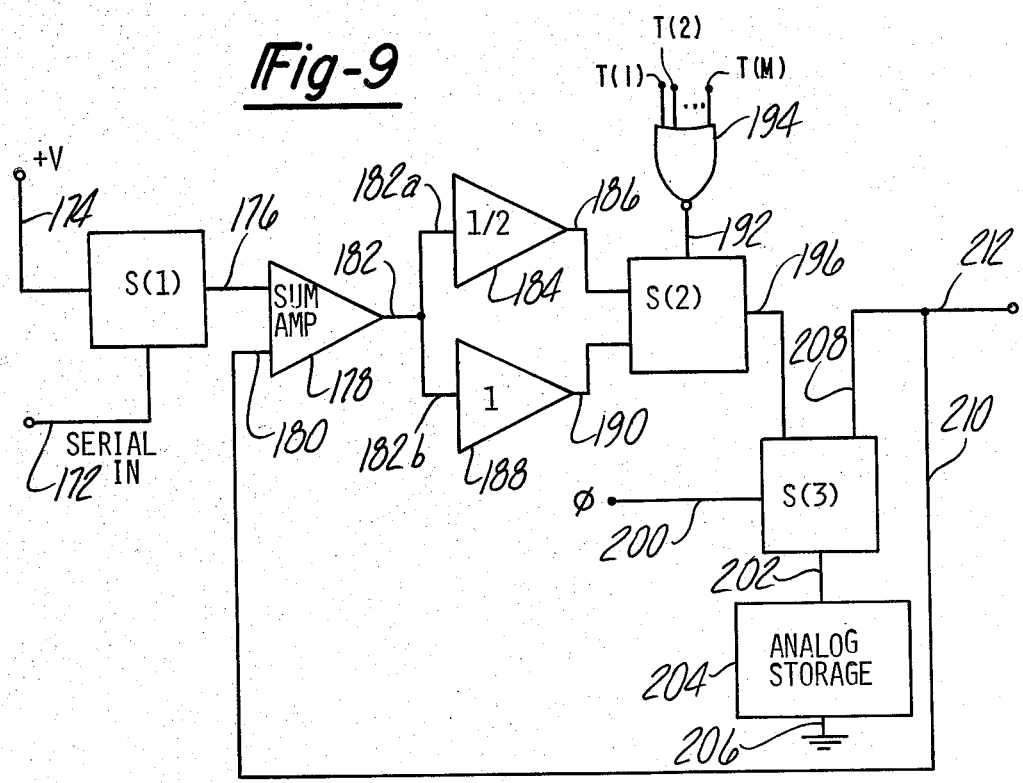
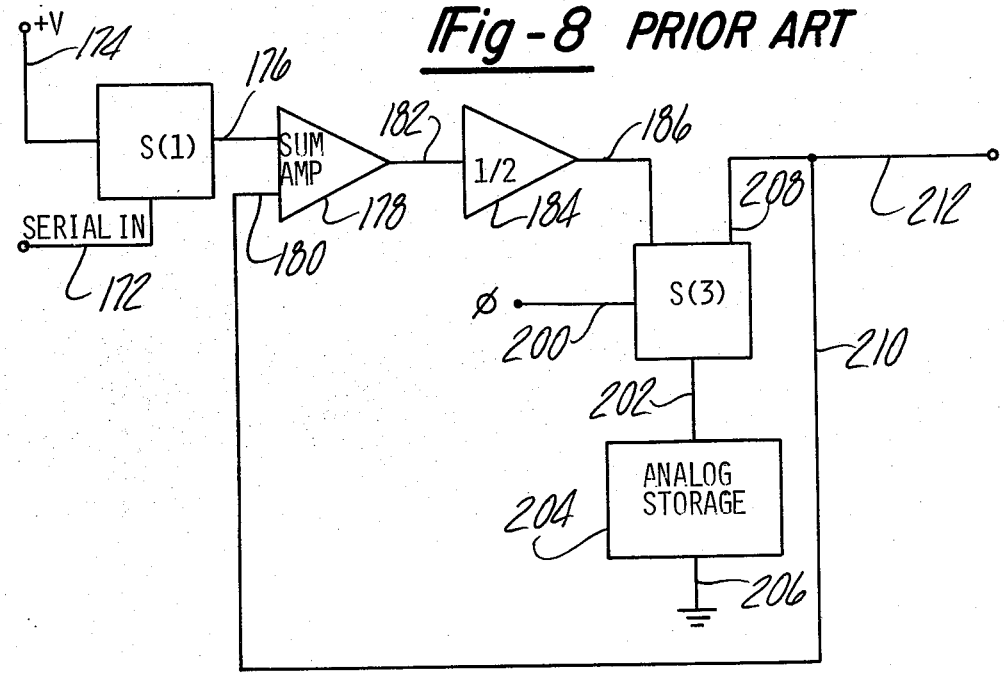

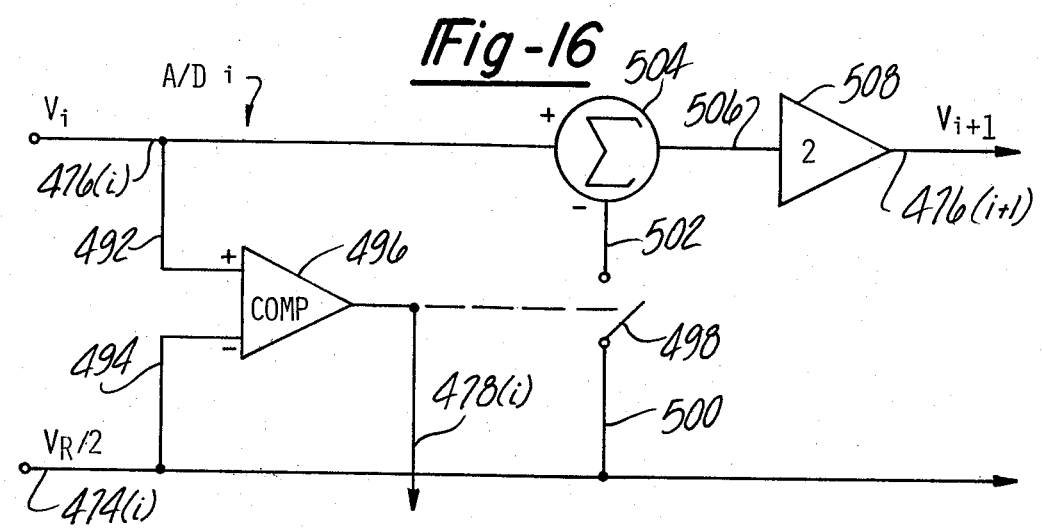
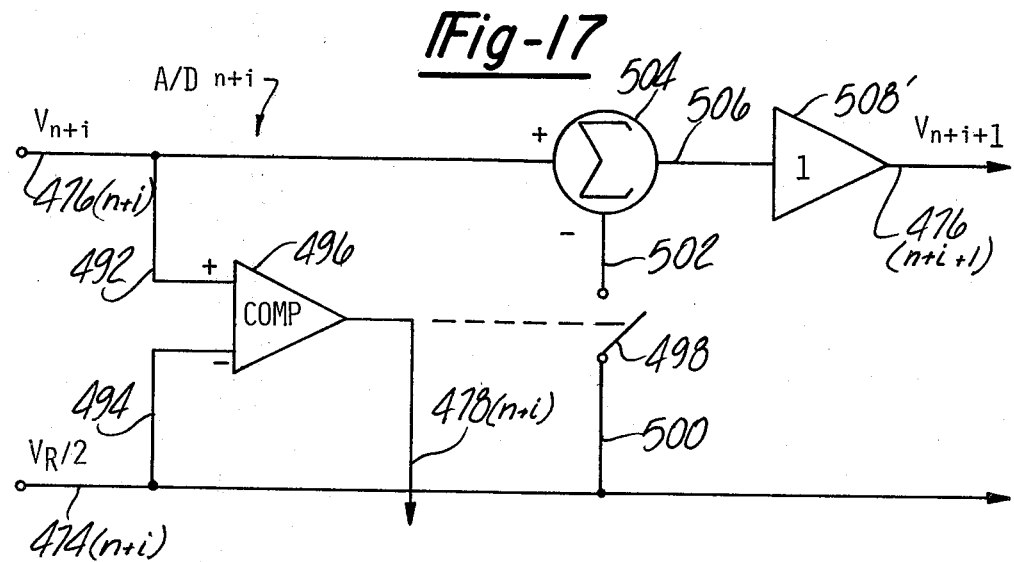

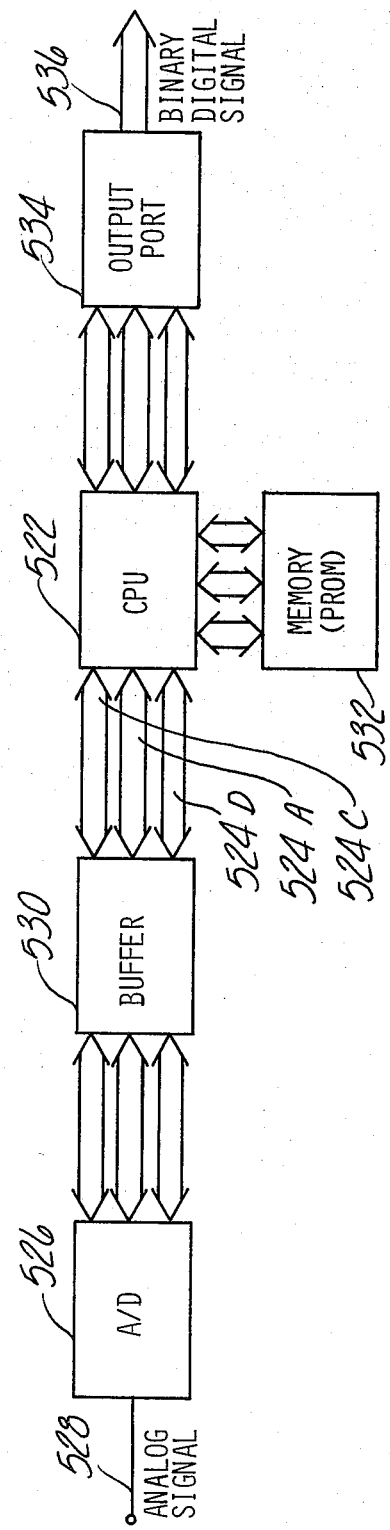
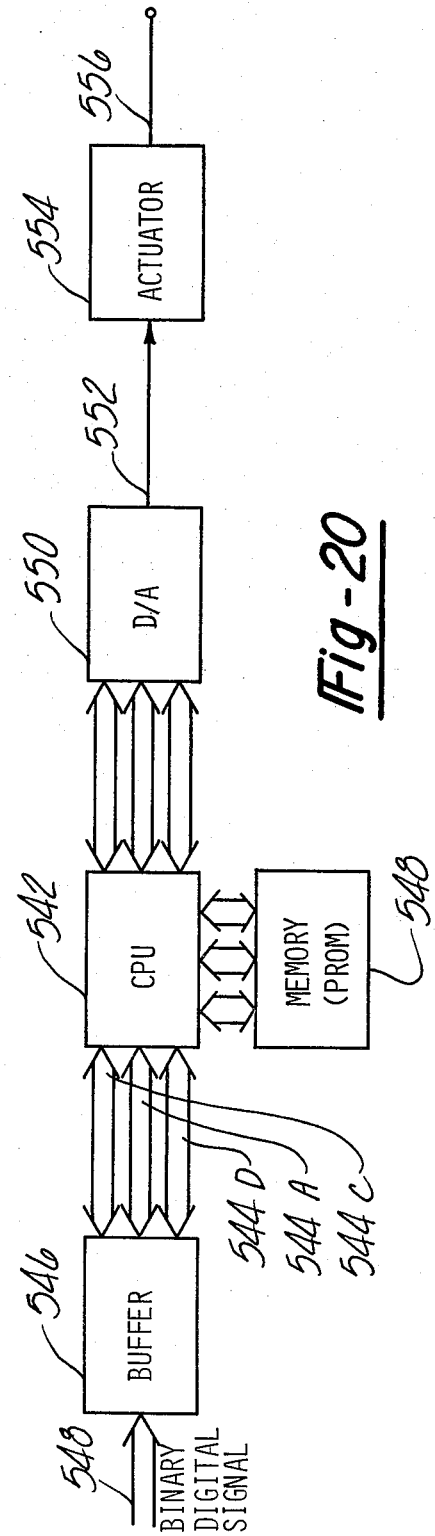

METHOD AND APPARATUS FOR CONVERSION OF SIGNAL INFORMATION BETWEEN ANALOG AND DIGITAL FORMS

TECHNICAL FIELD

The present invention relates to a method and apparatus for converting signal information between analog and digital forms, and more particularly to A/D and D/A conversion devices that employ stable but not highly accurate components for performing the conversion, and their associated method of operation.

BACKGROUND ART

There are many existing A/D and D/A converter designs for converting signals from analog to digital form and vice versa. Generally, in the conversion of a digital signal to a corresponding analog signal each bit of the digital signal is converted to a scaled analog equivalent in accordance with its bit position, and summed with all other proportionately scaled analog signals to produce a total analog signal that corresponds to the digital signal. A typical method of converting an analog signal into digital form is to successively compare the analog signal with subdivisions of a reference signal, each subdivision representing one bit and being related to other subdivisions through a power of two.

Whether the conversion is from analog-to-digital or from digital-to-analog, the converters generally require components of relatively high precision to assure adequate accuracy and resolution. If component values are not kept within a close tolerance of their nominal values, then the cumulative effect of excess tolerances will be reflected in converted signals that do not accurately correspond to the original signal. Specifically, excess component tolerances may cause an analog signal to be converted into a digital representation that is incorrect in one or more of the lower order bits and similarly may cause a digital signal to be converted into an analog signal whose magnitude corresponds to a similar but different digital signal. In summary, the accuracy of the converter is a direct function of the accuracy of the components, or, stated otherwise, the number of bits that can be handled by a converter is limited by the accuracy of the converter components.

The current thrust in electronics design is toward microelectronics, where LSI technology allows an entire circuit to be laid down in monolithic form on a single chip. If a circuit is to be produced in sufficiently large quantity, LSI technology affords significant savings in circuit size and cost. However, one recognized limitation of LSI technology is the inability to closely control the tolerances of circuit components. See in this regard, J. D. Meindl, "Microelectronic Circuit Elements", Science American, Sept. 1977, at 70, 76, There are methods for improving the accuracy of component values, e.g. laser trimming, but these methods too have their limitations and require additional chip fabrication costs that may be even so great as to defeat the cost-effectiveness of monolithic circuitry.

The present state of the art allows D/A and A/D converters to be fabricated on an LSI chip with an upper limit of accuracy on the order of $2^{-10}$ to $2^{-12}$ of maximum value, i.e. ten to twelve bits. The general precision of LSI circuit components does not generally permit the design of converters with resolution beyond that bit level. However, there are numerous applications for converters with up to sixteen bits.

It is an objective of the present invention to realize the efficiencies of LSI technology with a converter design and associated method of operation that accommodates imprecise component values without a corresponding reduction in converter accuracy.

DISCLOSURE OF THE INVENTION

The present invention is a method and apparatus adapted for either A/D or D/A signal conversion that affords a high degree of converter accuracy without requiring highly accurate converter components.

Boardly, the invention contemplates a converter apparatus and associated method of operation that performs the conversion in two basic steps. In the case of analog-to-digital conversion, the first step is the transformation of the analog signal into a unique digital representation in a general digital format; the generalized digital format is not necessarily based on a coding scheme where each digital bit position represents a power of two. The second step converts the unique digital representation in the generalized digital format into an equivalent representation in binary format, e.g. where each bit position represents a power of two. In the reverse process of digital-to-analog conversion, the normal binary digital signal is first converted into an equivalent signal in the general digitized format. The second step is conversion of the general digitized signal into an analog equivalent.

The invention is generally applicable to converter designs that use components that have a predetermined ratio to one another, whether it be 2:1, 1:1, or some other ratio. For example, a weighted-resistor D/A converter has N resistors for the conversion of an N-bit digital signal to an analog signal, where each of the N resistors has a resistance with a 2:1 ratio to the resistor in the immediately preceding stage. Other conventional converter forms accomplish essentially the same weighting of each digital bit in accordance with its bit position by using components having a predetermined ratio to one another.

The present invention may be used with a converter where the components are imprecise relative to usual converter component tolerances. More specifically, each component has associated with it a tolerance limit, but that tolerance limit is larger than normally acceptable tolerance limits for the particular converter design and the number of digital bits that it is to handle. The use of imprecise converter components is compensated for by using additional bits to compensate for errors. A converter modified in this manner will perform high accuracy D/A and A/D conversions, but not necessarily in agreement with conventional binary digital code. Stated otherwise, for each digital input signal, the modified D/A converter will produce an analog signal of unique magnitude; and for each analog signal of a specific magnitude the A/D converter will produce a unique digital signal, but not necessarily encoded in the usual binary or power-of-two format. This non-binary digital code was previously characterized as a generalized digital code.

The invention, therefore, contemplates a secondary conversion step where the generalized digital code is translated into binary digital code or vice versa. The generalized digital code associated with each individual converter will be unique to that converter, owing to the imprecise nature of its component values. Accordingly, each converter is tested to determine what output signal will result for each level of input signal. A table or other type of cross-reference is generated to establish a conversion between the generalized digital code uniquely associated with the converter and conventional binary digital code. The conversion between the generalized digital code and binary digital code can be established through an exhaustive testing process performed upon all newly fabricated LSI chips. Alternately, a statistically-based sample of test signals can be used.

In the preferred embodiment of the invention, the conversion between the code types is implemented as a look-up table in a PROM (programmable read-only-memory) or similar type storage device. The generalized digital code from the A/D converter is used as an address for the corresponding binary digital code. The translation between code types is accomplished by putting the generalized digital code on the address lines to the PROM and accessing the corresponding binary digital code stored at that address. Conversely, with a D/A converter, the binary digital input signal is used as an address for the corresponding word in the generalized digital code.

Although the preceeding description is in terms of a binary digital code being the desired or conventional digital code, the invention is applicable to any desired digital code. The bits of the desired digital code may have any set of desired relationships between bits, for example, binary-coded decimal or Gray coded binary.

The significance of the n+m bits of the special purpose code can be patterned after the normal n-bit code. For example, n bits of the n+m bit code may have the same nominal significance as the bits of the n-bit code. The m bits of the n+m bit code may have the same nominal significance as some of the low order bits of the n-bit code. Alternately, the n+m bits of the special purpose code need not be patterned after or repetitive of bits of the normal n-bit code. The only limitation on the special purpose code is that every analog value in the range represented by the normal n-bit code can also be accurately represented by the special purpose (n+m)-bit code. For example, the (n+m)-bit code can have smaller ratios between adjacent bit weights, instead of having n bits patterned directly after the normal n-bit code and m bits repetitive of one or more selected bits of the n-bit code. Other variations are also allowable within this more general level of the invention.

In this manner the invention can adapt a great variety of D/A and A/D converter designs to LSI technology and achieve high conversion accuracy without being limited by the inherently imprecise parameter values of LSI circuit components.

BRIEF DESCRIPTION OF DRAWINGS

FIG. 7 is a schematic representation of a parallel, resistor-ladder, digital-to-analog converter in accordance with the present invention;

FIG. 8 is a schematic representation of a general, serial digital-to-analog converter;

FIG. 9 is a schematic representation of a general, serial digital-to-analog converter, modified in accordance with the present invention;

FIGS. 16 and 17 are schematic representations of first and second types of single bit conversion stages forming the enumerated A/D conversion stages of FIG. 15;

FIG. 19 is a block-diagram representation of an analog-to-digital converter incorporating the present invention controlled by a programmable processing unit;

FIG. 20 is a block-diagram representation of a digital-to-analog converter incorporating the present invention controlled by a programmable processing unit.

BEST MODE FOR CARRYING OUT THE INVENTION

I. INTRODUCTION

Figure 1:
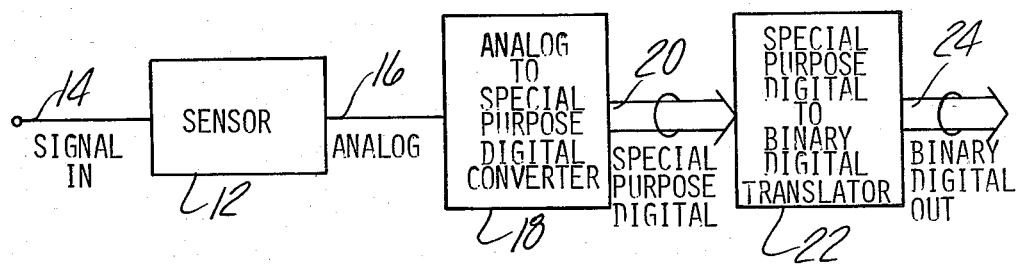
FIG. 1 is a block-diagram representation of an analog-to-digital conversion device in accordance with the present invention, also illustrating its associated method of operation.

The present invention is an improvement in the design and method of operation of devices for converting signal information between analog and digital form. The improvement concerns the relaxation of the normally stringent tolerances that are imposed on the components of these conversion devices.

In conventional converter design, the component tolerances are determined by the desired accuracy of the converter; the greater the accuracy, the more stringent the component tolerances. It is desirable to develop an improved converter design and associated method of operation that provides high conversion accuracy, without a corresponding reduction of component tolerances. An immediate benefit of such a converter design would be the ability to adapt the design and method of operation to large scale integrated (LSI) circuitry, where the inability to closely control the values of components on an LSI chip has limited converter accuracy in that technology.

In overview, the present invention performs the conversion in two steps, whether an A/D conversion or a D/A conversion. The initial step, in either case, is the conversion from the original form of the signal into a special purpose digital code having a number of bits in excess of the number of bits of the normal digital code. For example, if the normal digital code has an n-bit word, the special purpose digital code will have an (n+m)-bit word. The additional m bits are generally chosen to be repetitive of certain of the low order bits of the n-bit word. The second step in the conversion process then converts the (n+m)-bit word to the final form in accordance with a pre-established relationship between the special purpose digital code and the normal n-bit code.

The special purpose (n+m)-bit digital code is a unique function of each converter incorporating the invention and, in fact, is fortuitous in nature within a permissible range of possibilities. Each converter is allowed a tolerance on its component values that is larger than the tolerance allowed on a normal converter of the same accuracy. The increased tolerances cause the converter to transform an analog (or digital) input signal into a corresponding digital (or analog) output signal whose value cannot be determined without knowledge of the actual component values for that specific converter. Accordingly, the relationship between the input and output signals of the converter is unique to that converter and reflects the actual values of the components employed.

A converter incorporating the present invention is allowed larger component tolerances by increasing the number of bit positions in the special purpose digital code. More specifically, the special purpose digital code word uses n+m bits to obtain n bit accuracy, where m = 1, 2, .... The additional m bits are commonly chosen to be repetitive of the lowest or next-to-lowest order bits of the normal n-bit digital word.

The invention is hereinafter disclosed in a number of alternative embodiments, particularly as modified forms of A/D and D/A conversion devices disclosed in the following series of articles: Schmid, *D/A Conversion*, Electronics Design 22, Oct. 24, 1968, pp. 49–88; Schmid, *A/D Conversion*, Part 1, Electronic Design 25, Dec. 5, 1968, pp. 49–72; and Schmid, *A/D Conversion,- Part 2*, Electronic Design 26, Dec. 19, 1968, pp. 57–76. The entire disclosure of these articles is incorporated by reference herein. However, the invention is not limited in application to the specific converter types in this disclosure or in the incorporated matter.

II. A/D AND D/A CONVERSION SYSTEMS

FIG. 1 is a block diagram representation of an analog-to-digital conversion system (A/D) incorporating the present invention. The function of the A/D system is to receive an analog input signal and convert it into an equivalent n-bit binary digital output signal. The choice of a binary code format for the output signal, however, is merely exemplary; other forms of digital codes are likewise adaptable for use with the present invention. The system of FIG. 1 is described as follows:

A signal representing a condition of a physical variable is received on line 14 by a sensor or transducer 12. The sensor 12 outputs a corresponding analog signal, typically an electrical voltage or current, on line 16. The analog signal on line 16 is received by an analog-to-special purpose digital converter 18. The converter 18 performs a conversion of the analog signal into an (n+m)-bit digital word in a special purpose digital code uniquely associated with the converter. The (n+m)-bit word is transmitted on cable 20 to translator 22. The function of the translator is to convert the (n+m)-bit digital word to a corresponding n-bit binary coded digital word. In practice, the translator 22 may be a memory unit containing a look-up table giving the conversion between the (n+m)-bit digital word in the special purpose digital code and the corresponding n-bit digital word in the binary digital code. One method is to use the (n+m)-bit digital word as an address for the memory location of the corresponding n-bit binary digital word.

Figure 2:
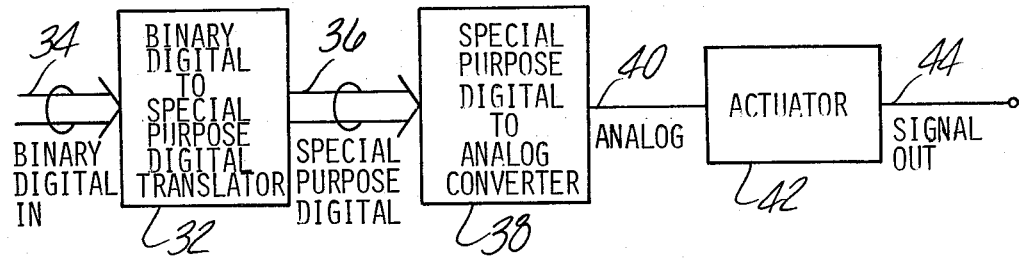
FIG. 2 is a block-diagram representation of a digital-to-analog conversion device in accordance with the present invention, also illustrating its associated method of operation.

FIG. 2 is a block diagram representation of a digital-to-analog (D/A) conversion system incorporating the present invention. The function of the D/A conversion system is to receive an n-bit digital signal in binary or other form of digital code and convert it into an equivalent analog signal. The D/A conversion system is described as follows.

The D/A conversion system of FIG. 2 includes a translator 32 that receives an n-bit binary digital signal on cable 34. The function of translator 32 is to convert the n-bit binary digital signal into a corresponding (n+m)-bit word in a special purpose digital code on cable 36. The (n+m)-bit word in the special purpose code is received by a converter 38. The function of the converter 38 is to convert the (n+m)-bit word into an equivalent analog signal appearing on line 40. The analog signal on line 40 is received by the actuator 42 that amplifies or otherwise buffers the signal before transmitting it on line 44 to an analog device.

The translator 32 may, like the translator 22 of FIG. 1, contain a look-up table relating each digital word in the n-bit binary digital code with its corresponding digital word in the (n+m)-bit special purpose digital code. The n-bit binary word may be used as an address to access the memory location containing the (n+m)-bit special purpose digital word.

The converters 18 and 38, of FIGS. 1 and 2, respectively, are most practicably modified forms of known converters that include extra stages or cycles to handle the additional m-bits of the special purpose digital code. FIGS. 4, 5, 6, 7 and 9 show D/A converters suitable for use as converter 38 of FIG. 2. FIGS. 10, 11, 12, 13, 14 and 15 show A/D converters that are suitable for use as converter 18 of FIG. 1. Each of the converters in the enumerated figures will presently be discussed in detail.

III. D/A CONVERTERS

A. Parallel D/A Converters

FIGS. 4, 5, 6 and 7 are all variants of parallel, D/A converters suitable for use with the present invention. Prior to a detailed description of each of these figures, a brief overview of the principles of a general-type, parallel D/A converter will first be discussed with reference to FIG. 3.

Figure 3:
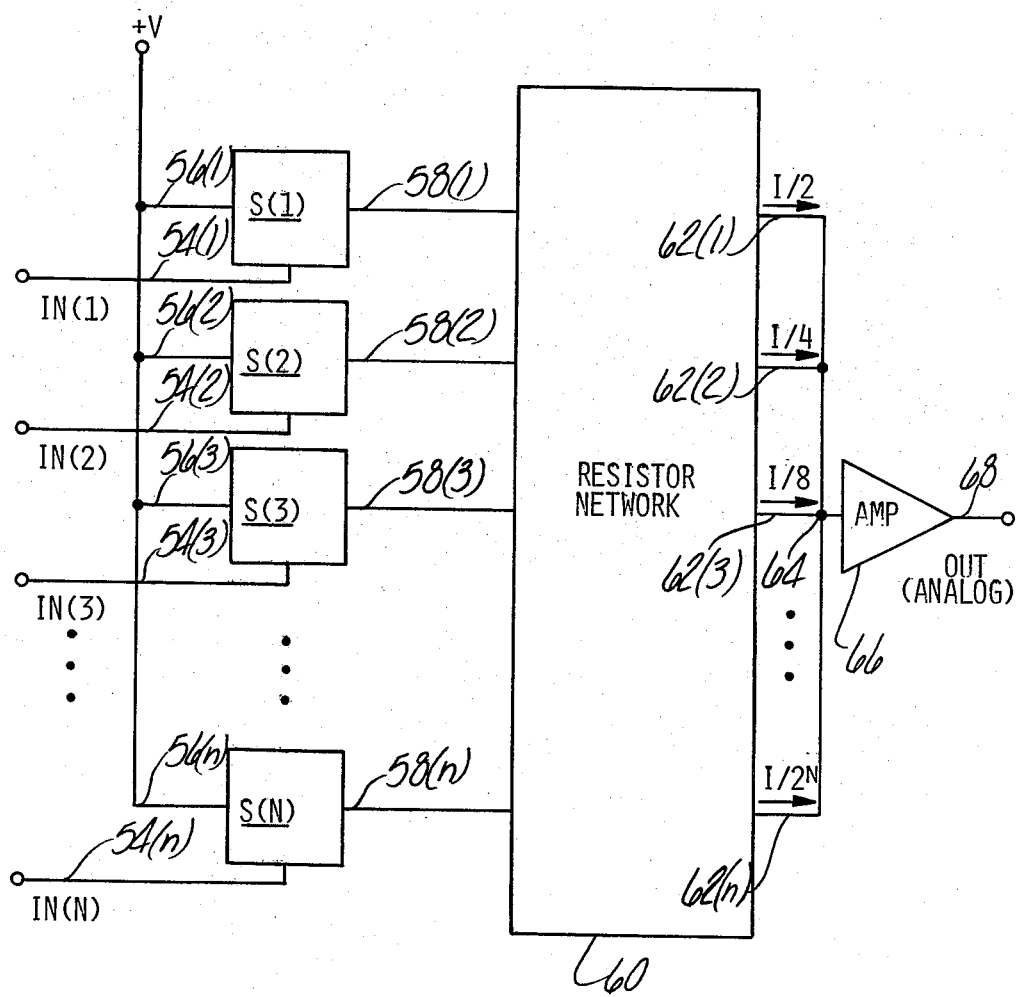
FIG. 3 is a schematic representation of a general, parallel digital-to-analog converter.

FIG. 3 is a schematic diagram of a general form of a parallel D/A converter. Within this classification are several converter types, including: weighted-resistor-D/A converter; resistor-ladder D/A converter; weighted-voltage D/A converter; and inverted ladder D/A converter. The generic representation of these converters, illustrated in FIG. 3, is briefly described as follows:

The converter comprises a plurality of stages equal in number to the number of bits in the digital input word IN. Each stage has associated with it an analog switch, S(1), S(2), S(3), ... S(N) of the single pole-single throw type. Each of the switches S has a control terminal 54 that receives the input bit value for its respective bit position. If the bit value IN (i) appearing on line 54(i) is high, i.e. a binary one, then the switch S(i) couples a reference voltage V on line 56(i) to line 58(i) that is connected to a resistor network 60. When the bit value is low, i.e. a binary zero, the switch S(i) decouples the lines 56 and 58.

The resistor network 60 can assume any one of various forms, as will hereinafter be made apparent in the discussion of FIGS. 6 and 7. The network 60 is internally divided into a plurality of stages likewise equal in number to the number of bits in the digital input word IN. Each stage translates the signal which may be received on associated line 58 into a current that is output on associated line 62. The current from each stage is scaled in accordance with the weight of the bit position of that stage, i.e. the order of the bit determines the magnitude of current appearing on associated line 62. In the case of a binary digital converter, each stage is weighted with respect to an adjacent stage by a factor of two. In this relationship, the highest order stage has a current magnitude of $I/2$, the second highest stage has a current magnitude of $I/4$, and the nth stage has a current magnitude of $I/2^n$. As used herein, the "weight" of a bit position is intended to mean its equivalent analog value.

The currents on all of the output lines 62 are combined at node 64 and supplied to an amplifier 66. The amplifier 66 outputs an amplified analog signal on line 68 that represents the sum of the currents from each stage, and is the analog equivalent of the digital input signal IN.

Figure 4:
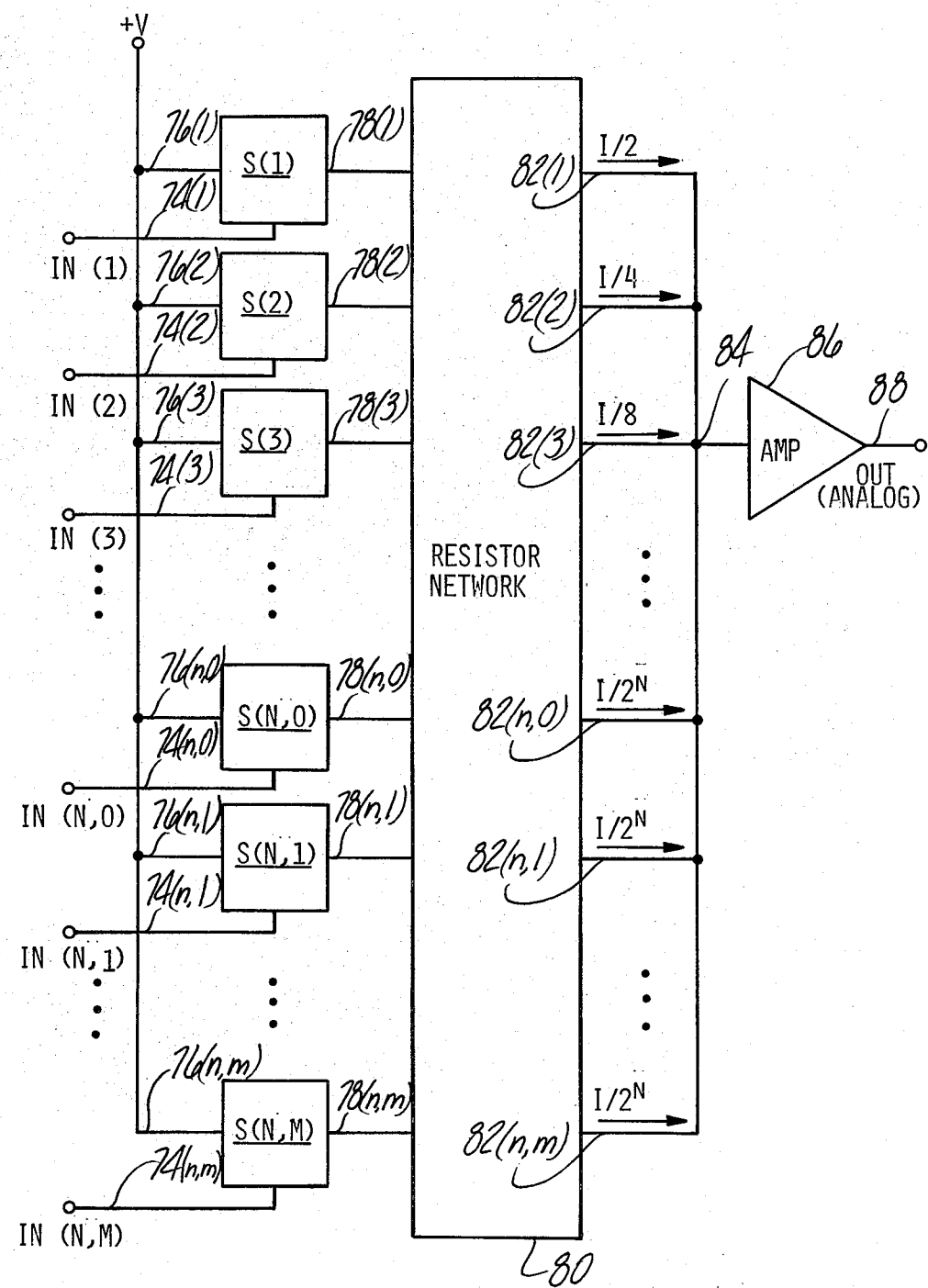
FIG. 4 is a schematic representation of a general, parallel digital-to-analog converter modified in accordance with the present invention.

FIG. 4 is a D/A converter of the type illustrated in FIG. 3 that has been modified according to the present invention. The D/A converter is divided into a plurality of stages equal in number to the number of bits in the digital input word IN. Now, however, the digital input word will be in the (n+m)-bit special purpose digital code, as was indicated by cable 36 of FIG. 2.

Each of the n+m stages has associated with it a switch, S(1), S(2), S(3), ... S(N,O), ... S(N,M). Each of the switches S(i) is a single pole-single throw analog switch having a control terminal 74(i). The signal appearing on control terminal 74(i) is the value of the bit for the ith bit position. If the bit value is high, i.e. a digital one, the switch S(i) couples a reference voltage V on terminal 76(i) to output terminal 78(i). If the bit value is low, i.e. a binary zero, the switch decouples line 76(i) from line 78(i).

A resistor network 80 receives its input from each of the lines 78 associated with the switches S. The resistor network 80 is internally divided into a plurality of n+m stages. Each stage of the resistor network 80 translates the signal on line 78 into a current scaled in accordance with the bit position of the stage. The scaled currents could be chosen in several ways. As labeled in FIG. 5, the highest order stage will produce a current on line 82(1) of $I/2$, the next highest order stage will produce a signal on line 82(2) of $I/4$, etc. In the illustrated embodiment, the ith stage of the first n stages produces a current having a value of $I/2^i$.

The final m stages, however, do not follow the binary relationship between the first n stages. In the disclosed embodiment, the low order m stages are chosen to be repetitive in weight of the nth stage. The nth stage is nominally the lowest order bit of the n-bit digital word in which the (n+m)-bit digital word was originally encoded. Stated otherwise, the resistor network 80 includes m repetitive stages of the lowest order bit. The current carried by each of the output lines 82 (n,0) through 82 (n,m) is equal to $I/2^n$. By the use of repetitive low order bits, the tolerances on the components used in each of the n+m stages can be relaxed beyond the tolerance levels normally allowed for a converter with n-bit accuracy.

All of the currents on lines 82 are summed at node 84 and provided to an amplifier 86 for amplification into an analog output signal on line 88 which is the analog equivalent of the original n-bit binary digital signal.

As stated previously, the scaled currents could be chosen in alternate ways. For example, the current produced in line 82(i), when the corresponding digital bit value is high, could alternately be $I/K^i$ for i from one to n+m. K can be any scale factor less than two, but greater than one, such that $K^{m+n}$ is greater than or equal to $2^n$. By the use of a K value less than 2, the tolerances on the components are relaxed proportional to the difference from 2.

Figure 5:
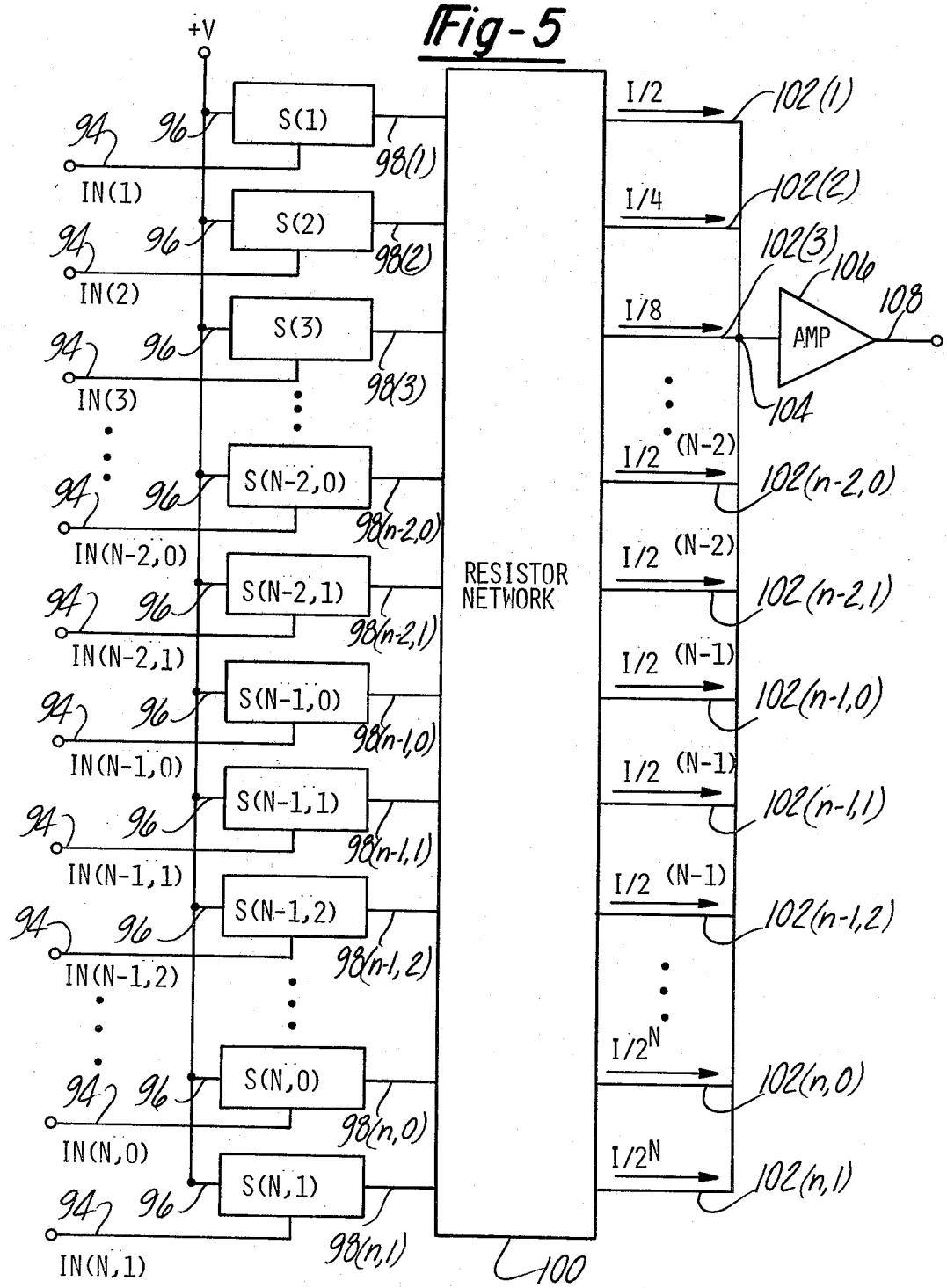
FIG. 5 is another schematic representation of a general, parallel digital-to-analog converter modified in an alternative manner in accordance with the present invention.

FIG. 5 illustrates a second, alternative parallel D/A converter suitable for use with present invention. Again, this D/A converter has a plurality of n+m stages which is equal to the number of bits in the digital input word IN, as was indicated by cable 36 of FIG. 2.

Each of the plurality of stages has associated with it a single pole-single throw analog switch S(1), S(2), S(3), etc. Each switch S(i) has a control line 94(i) that receives the bit value for that bit position in the digital input word. If the bit at the ith position is high, i.e. a binary one, the switch S(i) couples a reference voltage on line 96(i) to an output terminal 98(i). If the ith bit value is low, i.e. a binary zero, the switch S(i) decouples line 96(i) from line 98(i).

A resistor network 100 receives as input the signals on lines 98. The resistor network 100 is internally divided into a plurality of n+m stages. Each internal stage of the network 100 is weighted in relation to its position, and will produce a scaled output current on line 102 when the input signal on its associated line 98 is high. With the normal binary relationship between stages, the current appearing on the ith line 102(i) would be greater than the current appearing on the i+1th line 102(i+1) by a factor of two.

However, in the present D/A converter, selected ones of the low order bits are repeated through m stages. Specifically, the n−2th bit is repeated once, the n−1th bit is repeated two or more times; and the nth bit is repeated once. The use of repetitive low order bits will cause currents of repetitive weight to flow in lines 102.

The currents in lines 102 are summed at node 104 and provided as signal input to an amplifier 106. The amplifier 106 outputs a signal on line 108 which is the analog equivalent of the original n-bit digital word.

Figure 6:
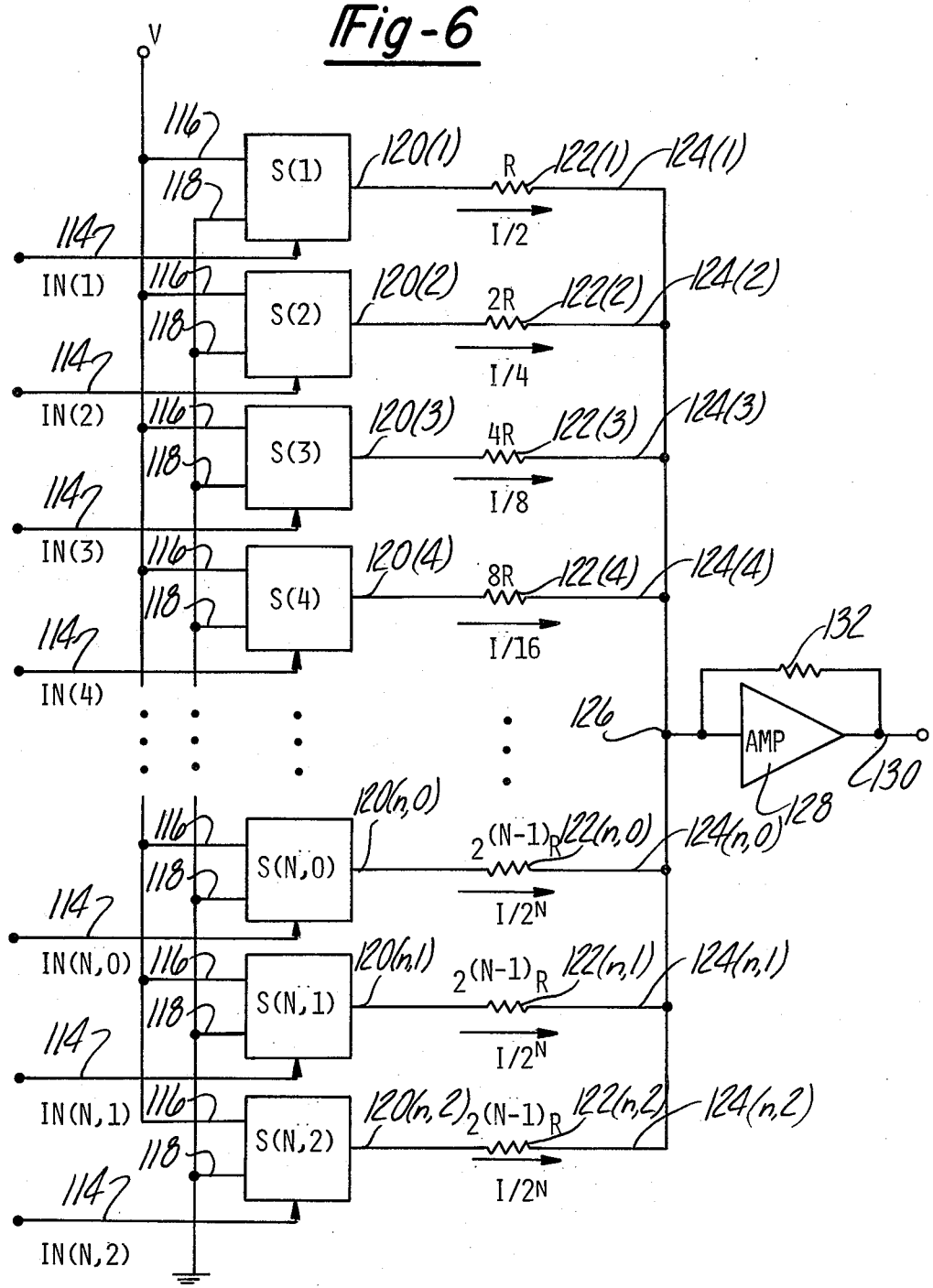
FIG. 6 is a schematic representation of a parallel, weighted-resistor digital-to-analog converter in accordance with the present invention.

FIG. 6 is a parallel D/A converter in accordance with the present invention that employs a weighted-resistor network as the resistor network 90 of FIG. 4. The D/A converter is divided into a plurality of n+m stages. Each stage has associated with it a single pole-double throw analog switch S. Each of the switches S has a control terminal 114 that receives the bit value for the bit position of that switch. In the present embodiment, each switch S also has a ground terminal 118 that is joined in common with the ground terminal of every other switch and held at zero potential. When the bit value appearing on control terminal 114 is high, the switch couples a reference voltage V on line 116 to output line 120. When the bit value on control terminal 114 is low, the switch S couples the ground potential on line 118 to line 120.

Each stage of the resistor networks comprises a resistance 122 having an ohmic value weighted in relation to its position in the network. When the signal on line 120(i) is high, the resistance 122(i) will produce a current scaled in proportion to the significance of the ith bit position. The highest order stage has a resistance 122(1) with an ohmic value of R and produces a current of I/2. The next highest stage has a resistance 122(2) of 2R and produces a current of I/4. In the present embodiment, this pattern holds for the first n stages, i.e. the ith stage has a resistance 122(i) equal to $2^{(i-1)}R$, and produces a current equal to $I/2^i$.

In the illustrated converter of FIG. 6 the number m is chosen equal to 2, and the last two stages are chosen to be repetitive in weight with the nth stage, which nominally represents the lowest order bit in the n-bit binary digital code. Each of the two repetitive stages has a resistance 122(n,1) and 122(n,2) equal in ohmic value to the resistance 122(n,0) of the nth stage, i.e. $2^{(n-1)}R$. The currents on lines 124(n,1) and 124(n,2) will, therefore, be equal in magnitude to the current on line 124(n,0).

The currents carried by all of the lines 124 are summed at node 126. The summed currents are received by amplifier 128 which produces an analog output signal on line 130 that is the analog equivalent of the original n-bit binary digital signal. The amplifier 128 has a feedback resistor 132 to stabilize its output.

FIG. 7 is another form of parallel D/A converter modified in accordance with the present invention; specifically, a resistor-ladder D/A converter. The D/A converter is divided into a plurality of n+m stages. Each of the stages includes a single pole-double throw analog switch, S. Each switch S has a control terminal 140 that receives the bit value for that bit position. Each switch S also has a ground terminal 146 that is connected in common with the ground terminals of the other switches and held at zero potential. If the bit value appearing on control terminal 140(i) is high, the switch S(i) couples a reference voltage V on terminal 144(i) to an output terminal 148(i). If the bit value appearing on control terminal 140(i) is low, the switch S(i) couples the ground potential on line 146(i) to terminal 148(i).

The voltage appearing on each line 148 is applied across a resistor 150 having a nominal resistance value of 2R. Each of the adjacent resistors 150 are normally interconnected by a resistor 152 having a nominal resistance of R. However, an exception is made for repetitively scaled stages. In the disclosed embodiment, the stage corresponding to the lowest order bit, i.e. the nth bit position, is repeated once. The resistors 150 for each of the repetitive stages are directly coupled together without an interposed resistor 152.

A resistor 156 having a nominal value of 2R is connected between the resistor 150 of the rightmost or highest order stage and the input 160 of an amplifier 158. The analog signal appearing on the amplifier output 162 is the analog equivalent of the original n-bit binary digital signal that was to be converted. A feedback resistor 164 is interconnected between the amplifier output line 162 and the amplifier input 160 to stabilize the amplifier 158.

The principles of operation of a resistor-ladder D/A converter are generally known. In brief, the current through each of the resistors 152(i) is branched off in equal parts at the common node with resistors 150 and 152(i−1). The contribution of each stage is measured by the amount of current attributable to it that flows into resistor 156. As each stage becomes more distant or remote from resistor 156, its contribution is reduced by a power of two. This principle is generally well-known in relation to a resistor-ladder network, and can easily be derived from Kirchoff's current law.

However, the repetitive stage associated with switch S(N,1) is scaled equally with the stage associated with switch S(N,0) which is the next stage nearer to resistor 156. Because there is no resistor 152 connecting the resistors 150 of these stages, the current from both of these stages experiences an equal number of divisions before reaching resistor 156. Accordingly, the two leftmost stages associated with switches S(N,1) and S(N,0) are equally scaled.

The resistor-ladder D/A converter of FIG. 7 is merely exemplary of a number of possible embodiments that are suitable for use with the present invention. For example, any two adjacent stages can be repetitively scaled by directly connecting resistors 150 of each of the respective stages, and removing the interposed resistor 152. The resistance values must also be computed to give the proper currents into resistor 156; the resistor values needed will no longer be only R and 2R.

B. Serial D/A Converters

FIG. 8 is a schematic diagram of a general form of serial D/A converter. FIG. 9 is a schematic representation of a serial D/A converter modified from the embodiment of FIG. 8 according to the present invention. It is helpful to obtain an understanding of the principles of operation of a general serial D/A converter as a basis for understanding how it may be modified for use with the present invention. Therefore, a brief description of the serial D/A converter of FIG. 8 will be given prior to a detailed description of the modified D/A converter of FIG. 9.

Referring to FIG. 8, the serial D/A converter includes a first switch S(1). The switch S(1) is a single pole-single throw analog switch having a control terminal 172. The control terminal 172 receives each bit of a digital input word in serial order, least significant bit first. The receipt of each bit is synchronized with the occurence of a clock pulse $\phi$. The timing pulse $\phi$ is represented on the first line of the timing diagram of FIG. 18. If the bit value appearing on control terminal 172 is high, the switch S(1) couples a reference voltage V on line 174 to output line 176. If the bit value appearing on control terminal 172 is low, the switch S(1) decouples line 174 from line 176.

A summing amplifier 178 receives as a first input the signal on line 176, and as a second input a feedback signal on line 180. The summing amplifier produces an output signal on line 182 that is the amplified sum of the input signals appearing on lines 180 and 176.

The amplified difference signal on line 182 is received by a scaling amplifier 184 that produces an output signal on line 186 that is one-half of the magnitude of the input signal on line 182. The signal on line 186 is received by another switch S(3). Switch S(3) is a single pole-double throw switch having a control terminal 200. The control terminal 200 has applied to it the periodic timing signal $\phi$. As can be seen in the timing diagram of FIG. 18, $\phi$ is high for one-half of the timing period and low for the other half. When $\phi$ is high, the switch S(3) couples line 202 to an output line 186. This applies the signal on line 186 to an analog storage device 204, typically a capacitance. The analog storage device 204 is coupled to ground through a line 206. During the second half of the timing period, the switch S(3) decouples lines 186 and 202, and couples lines 202 and 208. During this interval, the signal stored in the analog storage device 204 is applied by way of line 210 as the feedback signal to input 180 of the summing amplifier 178. In addition, this signal is provided as an output signal on terminal 212.

The conversion of the serial digital input word into an equivalent analog signal is accomplished through a plurality of cycles equal in number to the number of bits in the digital input word. Specifically, if there are n bits in the digital input word, then the equivalent analog signal appears as the output signal on terminal 212 after n timing periods.

The simplest modified form of serial D/A converter is the same as FIG. 8 with one exception: Scaling amplifier 184 produces an output 186 which is greater than one-half of its input 182, but less than its input. The serial input 172 now includes n+m bits, and the analog output 212 appears after n+m timing periods. If the scaling amplifier gain is 1/K, then K must be large enough so that $K^{m+n}$ is greater than or equal to $2^n$.

FIG. 9 illustrates a modified serial D/A converter for use with the present invention. The modified D/A converter incorporates the entire circuitry of the serial D/A converter of FIG. 8, plus certain additional components that provide for a digital input signal having m repetitively weighted extra bits.

The modified, serial D/A converter includes a switch S(1). The switch S(1) is a single pole-single throw switch having a control terminal 172. The control terminal receives the serially-ordered bits of the digital input word. In the present case, it is assumed that the digital input word has n+m bits, as was indicated by the cable 36 of FIG. 2. If the bit value on line 172 is high, the switch S(1) will couple a reference voltage on line 174 to line 176. If the bit value on line 172 is low, the switch S(1) will decouple lines 174 and 176.

A summing amplifier 178 has as a first input the signal on line 176, and as a second input signal a feedback signal on line 180. The summing amplifier 178 produces an output signal on line 182 that is the amplified sum of the signals on line 180 and 176.

Line 182 branches off into two parallel signal paths 182a and b. A first scaling amplifier 184 receives the signal on line 182a. The output of the amplifier 184 appears on line 186 as one-half of the amplitude of the signal on line 182a.

A second scaling amplifier 188 receives the signal on line or signal path 182b. In the illustrated embodiment, the second scaling amplifier 188 has a gain of unity, and the output signal appearing on line 190 is equal to the input signal on line 182b. In the practical embodiment of the invention, where the scale factor of the second scaling amplifier 188 is unity, the amplifier can be deleted in favor of a direct connection between lines 182b and 190. In fact, the selection of a scale factor of unity for the second scaling amplifier 188 is synonymous with such a direct connection.

Figure 18:
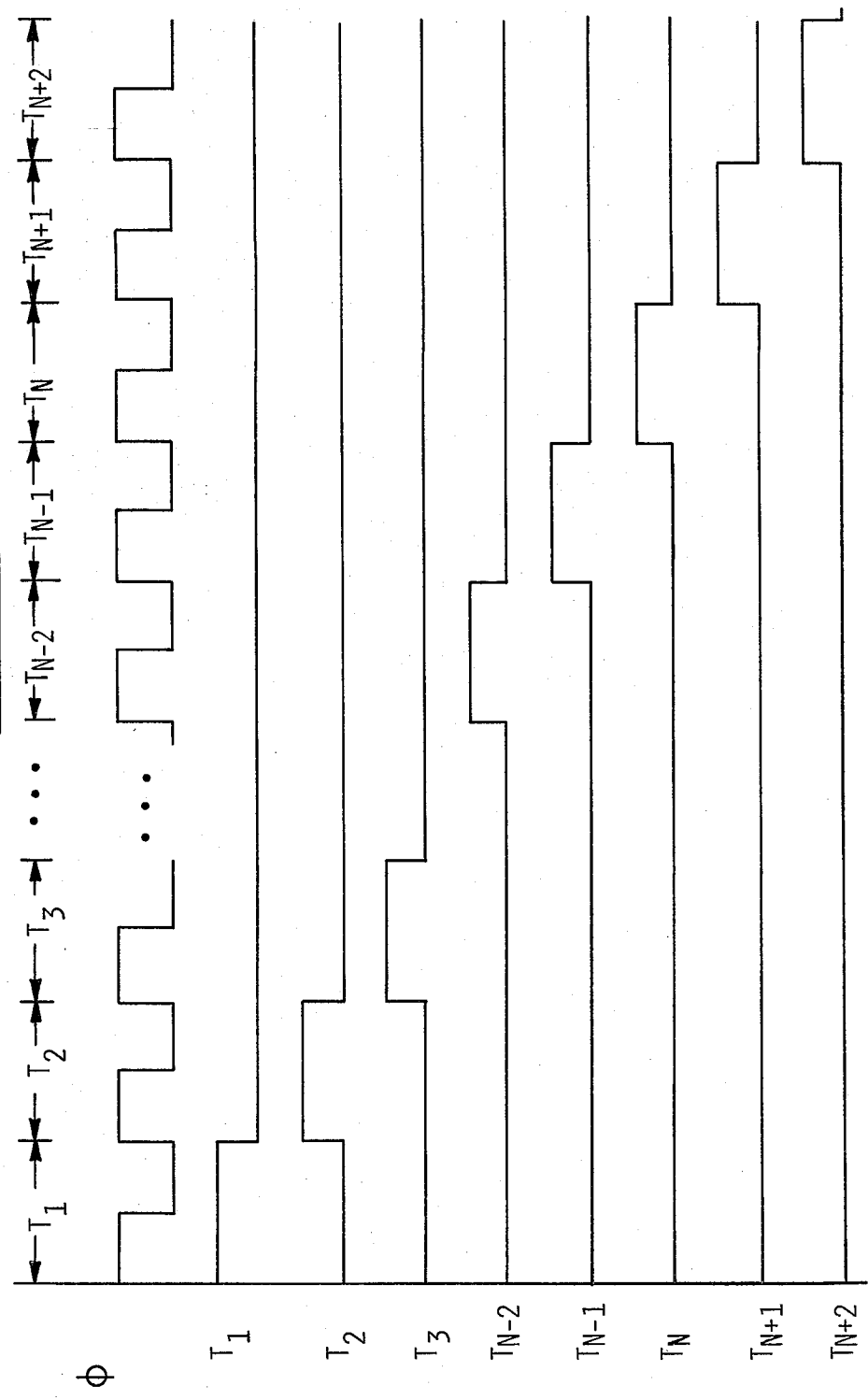
FIG. 18 is a timing diagram showing the relationship of various timing signals used in the converters of the preceding figures.

A second switch S(2) receives the signals on lines 186 and 182. The switch S(2) is a single pole-double throw analog switch having a control terminal 192. The signal appearing on the control terminal 192 is governed by the output of a NOR gate 194. The NOR gate 194 has a plurality of input terminals equal in number to the m extra bits. Each of the NOR gate input terminals is coupled to a timing signal, T, that goes high during the clock period associated with the corresponding repetitive bit. The timing diagram of FIG. 18 illustrates schematically the timing signal T for each of the n+m bits of the digital input word.

If any one of the input signals T applied to the NOR gate 194 is high, then the output signal of the NOR gate on the control terminal 192 is low. A low control signal will cause the single pole-double throw switch S(2) to couple lines 190 and 196.

If none of the input signals T to the NOR gate 194 are high, then the output signal of the NOR gate on control terminal 192 will be high. A high control signal will cause the double pole-single throw switch S(2) to couple lines 186 and 196. The coupling of lines 186 and 196 was the normal relation in the unmodified serial D/A converter of FIG. 8.

A third switch S(3) receives the output signal on line 196 from the second switch S(2). The switch S(3) is a single pole-double throw analog switch having a control terminal 200. The control terminal 200 receives the periodic timing signal $\phi$. During the first half of each clock period when $\phi$ is high, the switch S(3) couples lines 196 and 202. This coupling provides a path for the signal on line 196 to an analog storage device 204, typically a capacitance. The storage device 204 has a terminal 206 connected to ground.

During the second half of the clock or periodic timing signal $\phi$, the switch S(3) decouples lines 196 and 202, and couples lines 202 and 208. The line 208 branches into a first line 210 that carries the signal value stored in the storage device 204 back to the input 180 of the summing amplifier 178 as the feedback signal. A second branchs 212 represents an analog output signal terminal.

The modified, serial D/A converter converts the (n+m)-bit digital input word into the equivalent analog signal after n+m interative cycles through the converter. That is, the analog output signal appearing on terminal 212 after the n+mth clock period is the analog equivalent of the original n bit binary digital input signal.

The modified, serial D/A converter of FIG. 9 is generic to a class of modified serial D/A converters. More specifically, the converter of FIG. 9 is provided as a generic model of any one or more of the following specific, serial D/A converter types modified in accordance with the present invention: Shannon-Rack decoder; sample-hold D/A converter; cyclic-D/A converter; and charge-equalizing D/A converter. Each of these latter-recited specific converter types is described in its unmodified form in the first of the earlier-referenced Schmid articles.

IV. A/D CONVERTERS

A. Parallel A/D Converters

Referring again to FIG. 1, the block-diagram representation of an A/D converter system incorporating the present invention includes an analog to special purpose digital converter 18. There are a plurality of known converter types that may be modified in accordance with the present invention to function as the analog to special purpose digital converter 18. More specifically, the A/D converter types illustrated in FIG. 10, 11, 12, 14 and 15 are all forms of known A/D converter types that have been modified for use with the present invention. Each of the converter types shown in these figures will be described presently.

Figure 10:
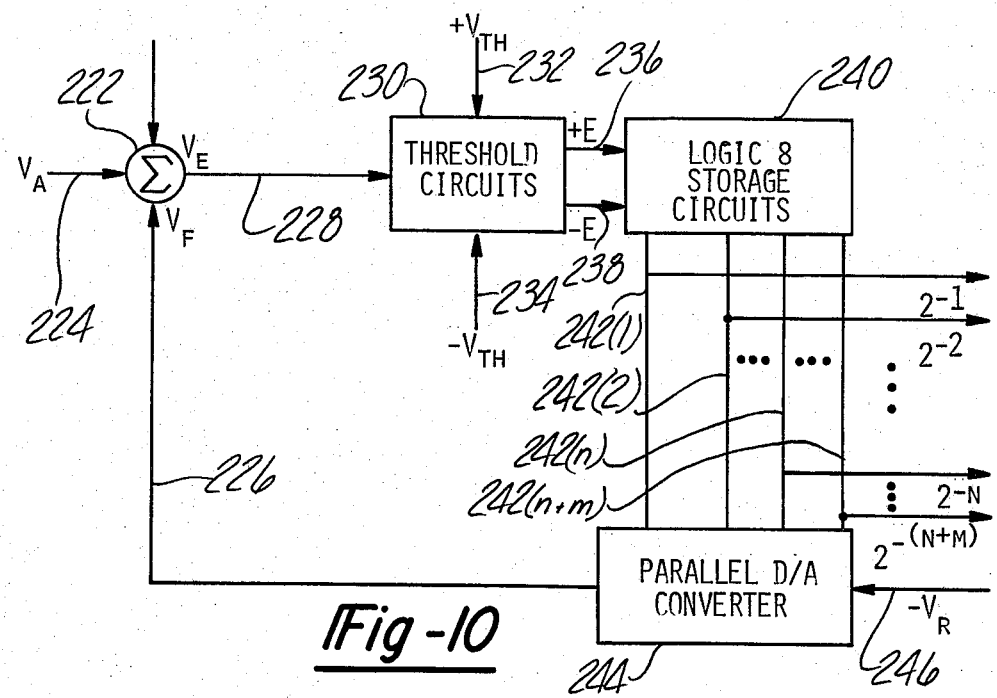
FIG. 10 is a schematic representation of a general, parallel-feedback analog-to-digital converter in accordance with the present invention.

FIG. 10 is a schematic diagram of a general, parallel feedback A/D converter modified according to the present invention. The A/D converter includes a summing circuit 222 that has a first input 224 receiving an analog input voltage $V_A$, and a second input line 226 that carries the feedback voltage $V_F$, which is of opposite polarity to the analog voltage $V_A$. The summing circuit 222 produces an error or difference signal $V_E$ on line 228 that represents the difference between the analog input and feedback voltages.

A threshold circuit 230 receives the difference signal $V_E$ on line 228. The function of the threshold circuit 220 is to produce an up or down count pulse, $+E$ or $-E$, respectively, depending on the polarity of the difference signal $V_E$. The threshold circuit has control input lines 232 and 234 that are held at upper and lower threshold voltages, $+V_{TH}$ and $-V_{TH}$, respectively. The absolute value of the threshold voltages is selected as a function of the magnitude of the least significant bit in the (n+m)-bit digital output word. If the difference voltage $V_E$ is more positive than the positive threshold voltage $+V_{TH}$, the threshold circuit 230 outputs a count-up pulse $+E$ on line 36. If the difference voltage $V_E$ is more negative than the negative threshold voltage, the threshold circuit 230 outputs a count-down signal $-E$ on line 238.

A logic and storage circuit 240 receives as input the up and down count signals, $+E$ and $-E$ respectively. The function of the logic and storage circuit 240 is to count up or down, in response to the signals on lines 236 and 238, through an (n+m)-bit digital word. The logic and storage circuit sets one bit position for each count pulse received on either lines 236 or line 238. The output of the logic and storage circuit 240 is an (n+m)-bit digital word carried on lines 242(1), (2), ... (n) ... (n+m).

A parallel D/A converter 244 receives as input the (n+m)-bit digital word appearing on lines 242. The parallel D/A converter 244 may, for example, be any of the types of parallel D/A converter earlier described herein. The converter 244 has n+m conversion stages corresponding to the bits on lines 242. A reference voltage $-V_R$ of negative polarity is received on line 246 by the converter 244. The output signal of the converter 244 appears on line 226 as the feedback voltage $V_F$. In practical effect, the feedback voltage $V_F$ is the negative analog equivalent of the (n+m)-bit digital word appearing on line 242. The comparison of the analog input signal $V_A$ with the feedback signal $V_F$ determines whether the digital word on lines 242 is less than, greater than, or equal to the analog input signal $V_A$. The (n+m)-bit digital word appearing on line 242 after $2^{(n+m)}$ cycles or some lesser number of iterations of the converter will define the digital output word in the special purpose code, as was shown by cable 20 of FIG. 1.

Figure 11:
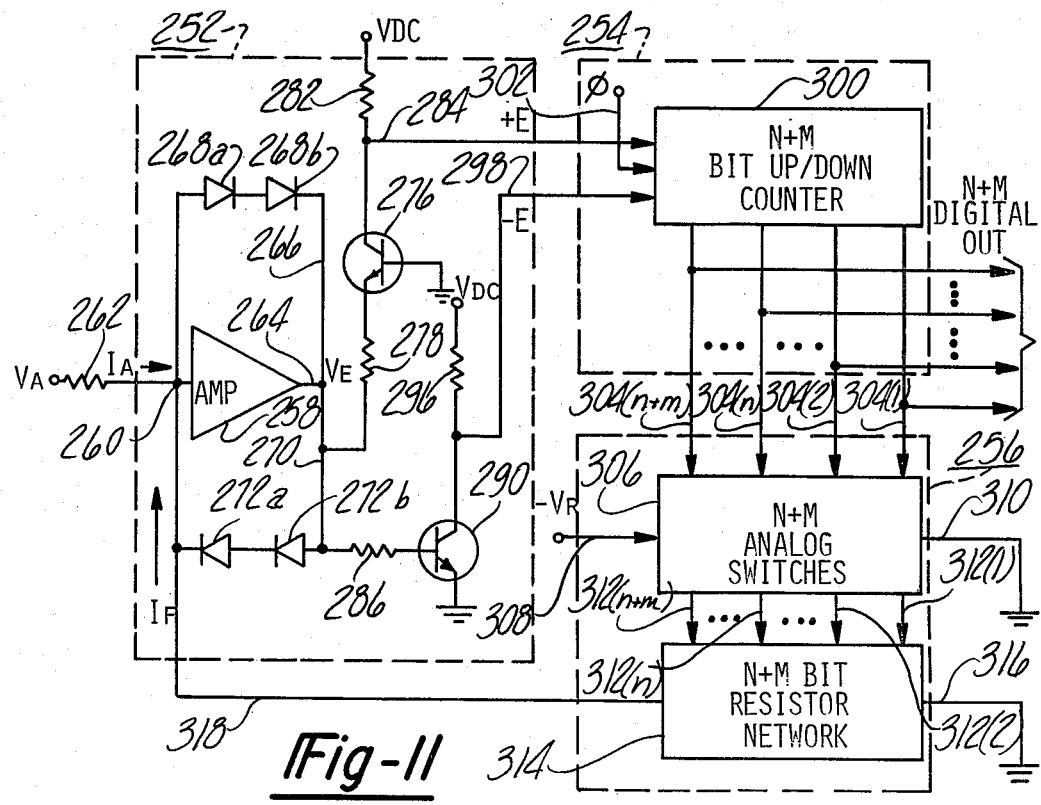
FIG. 11 is a schematic representation of a servo analog-to-digital converter in accordance with the present invention.

FIG. 11 illustrates a servo-A/D converter, that is modified in accordance with the present invention. The servo-A/D converter is a species of the general parallel feedback A/D converter of FIG. 10.

The servo-A/D converter is logically divided into three distinct stages: a summing and threshold stage 252, and up/down counting stage 254, and a D/A conversion stage 256. Each of these stages will be individually discussed as follows.

The general function of the summation and threshold stage 252 is to perform a comparison of a feedback signal from the D/A conversion stage 256 with an analog input voltage $V_A$, and produce an up or down count signal depending upon whether the comparison shows the feedback signal to be less than or greater than the analog input signal, respectively.

The summing and threshold stage 252 includes a high-gain DC amplifier 258. The amplifier 258 receives as input the current flowing into it from node 260. The input current is the difference between a first current component $I_A$ caused by the analog input signal $V_A$ applied across a resistor 262, and a second current component $I_F$ that flows in line 318 as the output from the D/A conversion stage 256. The difference between the currents $I_A$ and $I_F$ is reflected as an amplified error or difference voltage $V_E$ appearing on output line 264.

The upper and lower bounds of the error or difference voltage $V_E$ are defined by a pair of respective upper and lower feedback paths 266 and 270. The upper feedback path 266 includes a pair of serially-connected diodes 268a and b. The anode of diode 268a is connected to node 260, and the cathode of diode 268b is connected to output line 264 to limit the difference voltage $V_E$ to values smaller than approximately 1.2 volt. Similarly, the lower feedback path 270 includes a pair of serially-connected diodes 272a and b. The diode 272a has its cathode connected to the node 260, and the diode 272b has its anode connected to output line 264, to limit $V_E$ to values more positive than approximately −1.2 volt.

The difference voltage $V_E$ is first applied through a resistor 278 to the emitter of an NPN transistor 276. The base of the transistor 276 is grounded, and the collector is energized through a resistor 282 by a reference voltage $V_{DC}$.

The difference voltage $V_E$ is also applied to the base of another NPN transistor 290 through a resistor 286. The emitter of the transistor 290 is held at ground potential, and the collector is energized by the reference voltage $V_{DC}$ through a resistor 296.

When the difference voltage $V_E$ is within a deadband centered at 0 volts with a radius of approximately 0.6 volt, neither of the transistors 276 and 290 become conductive. However, when the difference signal $V_E$ is negative and outside the range of the deadband, the base-emitter voltage of the transistor 276 becomes great enough to cause that transistor to become conductive. This indicates a negative error and causes a count up signal $+E$ to appear on line 284. In the complementary situation, where the difference voltage $V_E$ is outside of the deadband and positive, the base-emitter voltage of the transistor 290 will become sufficiently great to cause that transistor to become conductive. This indicates a positive error condition, and causes a countdown signal $-E$ to appear on line 298.

The up/down counting stage 254 comprises an (n+m)-bit up/down counter 300. The counter 300 receives as input the count signals on lines 284 and 298 and a clock or periodic timing signal $\phi$ on line 302. The counter 300 will count up or down once for each clock signal depending upon the occurrence of one or the other of the count signals $+E$ or $-E$ on lines 284 and 298, respectively. The output signal of the counter 300 is an (n+m)-bit digital word carried on lines 304(1), (2), ... (n), ... (n+m).

The D/A conversion stage 256 performs a digital-to-analog conversion of the (n+m)-bit digital word carried on lines 304. The D/A converter stage 256 includes a switching circuit 306 having n+m analog switches, and a cooperative resistor network 314 having n+m conversion stages.

The switching network 306 receives as input the (n+m)-bit digital word on line 304. An inverted reference voltage $V_R$ is applied on line 308 to each of the n+m analog switches. A ground terminal 310 is likewise coupled to another terminal of each of the n+m analog switches. Each of the analog switches is preferably a single pole-double throw switch that couples $-V_R$ to its associated output line 312 when the bit value on the corresponding input line 304 is high, and couples the ground terminal 310 to its associated output line 312 when the bit value on its corresponding input line 304 is low. Accordingly, the output of the switching circuit 306 on line 312 will have the reference voltage $-V_R$ on each line 312 where a binary one or high signal appeared on the corresponding input line 304, and the ground potential on each line 312 where a binary zero or low signal appeared on the corresponding input line 304.

The (n+m)-bit resistor network 314 has each of its stages receiving the output signal of the corresponding stage in the switching circuit 306. The resistor network 314 may, for example, be a resistor-ladder network as was illustrated in FIG. 7 and described in connection therewith.

A ground terminal 316 provides a ground connection for the resistor network 314. The output of the resistor network 314 is a feedback current $I_F$ that flows on line 318 to node 260, as was hereinbefore described. The feedback current $I_F$ is the analog current equivalent to the (n+m)-bit digital word appearing on lines 304.

The output signal of the servo-A/D converter 250 is the (n+m)-bit digital word appearing on lines 304 where there is no signal on $+E$ or $-E$, or at the latest by the $2^{(n+m)}$ clock signal. This (n+m)-bit digital word corresponds to the signal carried on cable 20 of FIG. 1.

Figure 12:
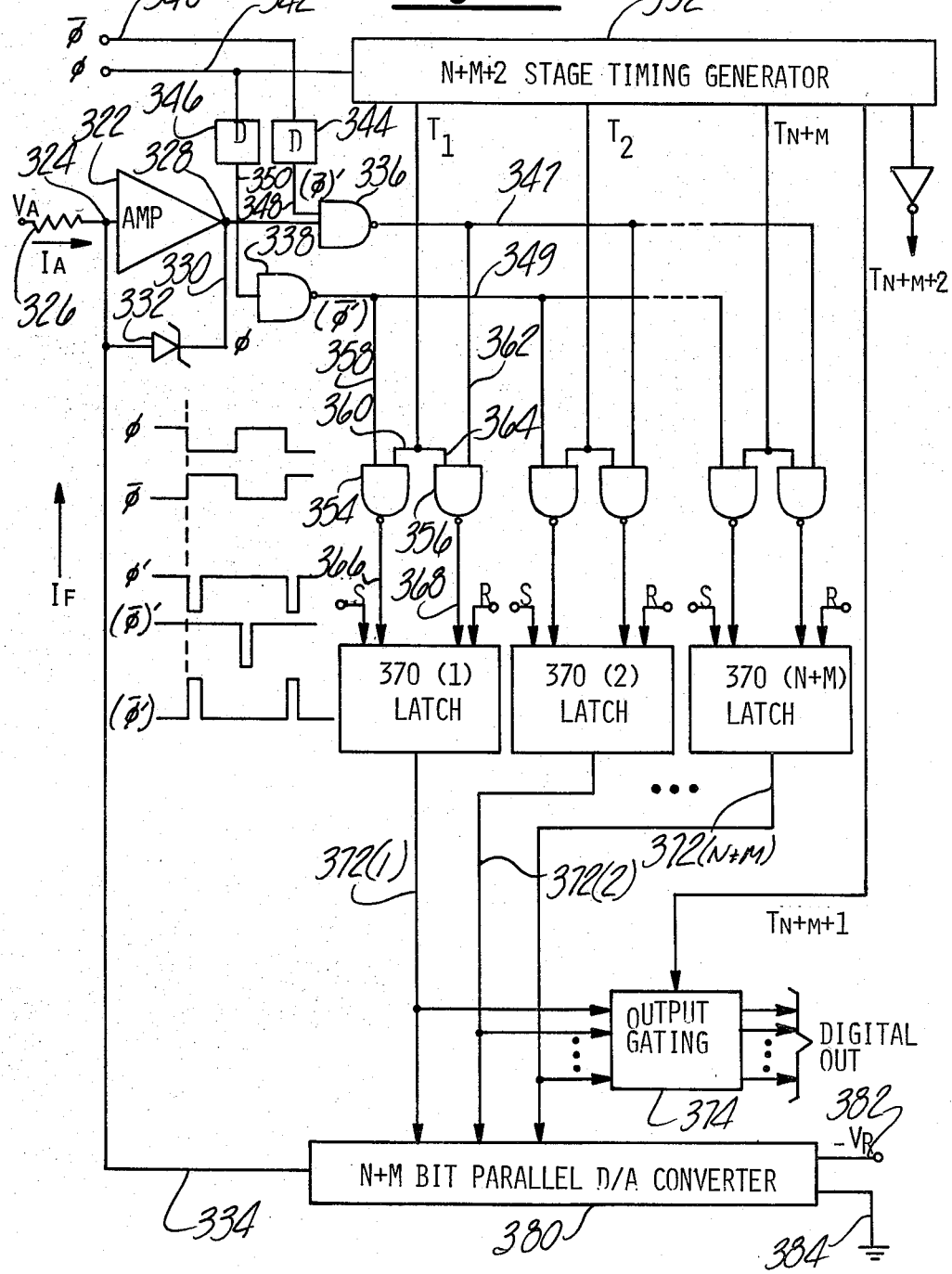
FIG. 12 is a schematic representation of a successive-approximation analog-to-digital converter in accordance with the present invention.

FIG. 12 is a successive-approximation A/D converter that represents another species of the general, D/A converter of FIG. 10. The successive-approximation A/D converter has been modified from its conventional form for use in accordance with the present invention and is described in detail as follows:

The successive-approximation A/D converter includes an amplifier 322 that produces an output signal at node 328 that represents the amplified sum of the currents flowing into input node 324. One current component flowing into the node is the analog input current $I_A$ that is caused by the application of the analog input voltage $V_A$ to the input terminal of resistor 326. The other current component is a feedback current $I_F$ that flows on line 334. The polarity of the feedback current $I_F$ is opposite that of the analog input current $I_A$, and therefore the current flowing from mode 324 into the amplifier 322 is the difference in the magnitude between these two currents.

The amplifier 322 has a feedback path 330 including a zener diode 332 whose purpose is to limit the output voltage swings of the amplifier between a range of $-0.6$ volt and $+3.0$ volts, whereby a level of $-0.6$ volt indicates that the absolute value of the analog input current $I_A$ is larger than the feedback current $I_F$ and the level of $+3.0$ volts indicates that the absolute value of the analog input current $I_A$ is smaller than the feedback current $I_F$. There is no information indicating when the currents are equal in magnitude, as this information is not necessary for converter operation.

The output signal of the amplifier 322 is applied directly to one input of a NAND gate 336. The other input signal on line 348 to the NAND gate 336 is the time derivative of the inverse of the clock signal $\phi$. This signal is developed by applying the inverse of the clock signal on line 340 to a differentiator 344. The output of the differentiator is directly coupled to the NAND gate 336 by line 348.

Another NAND gate 338 has a single input and functions as an inverter for the time derivative of the clock signal $\phi$. Specifically, the clock signal $\phi$ is applied by line 342 to another differentiator 346. The output of the differentiator 346 is applied directly by line 350 to the NAND gate 338.

The clock signal $\phi$ is also applied as input to an $N+M+2$ stage timing generator 352. The timing generator 352 produces a set of at least n+m+2 timing signals $T_1, T_2, \ldots T_{n+m}, \ldots T_{n+m+2}$. The timing generator 352 can be implemented as an (n+m+2)-bit ring counter with n+m+2 flip-flops interconnected as a shift register and with additional logic to set the first stage to one when all other stages are zero. Such a ring counter can be built very economically with a serial-IN, parallel-OUT shift register.

A set of n+m bistable latches 370(1), 370(2), ... 370(n+m) correspond to the n+m bits of the digital output word of the converter. Each of the bistable latches 370 is identical to the other latches, and a description of latch 370(1) is provided as representative of all the latches.

The bistable latch 370(1), which is the highest order latch, has a set input S and reset input R. The latch 370(1) is set, i.e. its output signal becomes high, when the signal applied to one of its set terminals is low, and the latch is reset, i.e. its output signal becomes low, when the signal applied to one of its reset terminals is low. The latch 370(1) receives input signals on lines 366 and 368 that are a function of the set of n+m timing signals T, the clock signal $\phi$ and the difference signal from the amplifier 322. More specifically, the output signal from the NAND gate 336 on line 347 is applied on line 362 as one input to a NAND gate 356. The other input signal on line 364 is the timing signal corresponding to this latch, in this instance $T_1$. The same timing signal is likewise applied as an input signal on line 360 to another NAND gate 354. The other input signal to NAND gate 354 is the inverse of the derivative of the clock signal $\phi$. This signal is carried on line 358 which is connected to the output line 349 of NAND gate 338.

The output condition of the latch 370(1), i.e. the signal appearing on line 372(1), will undergo the following transition during timing period T1. The latch is initially set by applying a low signal to line 366. This is accomplished by gating the timing signal $T_1$ and the inverse of the derivative of the clock signal $\phi$ through the NAND gate 354. The latch 370(1) will remain set if the amplifier output signal at node 328 is low for this timing period, indicating that the bit position represented by this latch is needed to approximate the analog input signal $V_A$. On the other hand, the latch will be reset if the amplifier output signal at node 328 is high, indicating that the bit position represented by this latch is not needed to approximate the analog input signal. To reset the latch when needed, the amplifier output signal appearing at node 328 and the derivative of the inverse of the clock signal on line 348 are applied to NAND gate 336. The output signal of the NAND gate 336 appearing on line 362 and the timing signal $T_1$ are applied to NAND gate 356. If the amplifier output signal at node 328 is low, then latch 370(1) will not be reset. However, if the signal at node 328 is high, then the latch will be reset.

This basic process is repeated n+m times, once for each of the latches.

An (n+m)-bit parallel D/A converter 380 receives as input the signals on lines 372(1), 372(2), ... 372, (n+m). The function of the D/A converter 380 is to convert its (n+m)-bit digital input word into a corresponding feedback current $I_F$ on line 334. The D/A converter 380 may be any one of the several types of such converters hereinbefore described. Each of the n+m stages of the D/A converter 380 is energized by a negative reference voltage $-V_R$ on line 382. Each of the stages is likewise connected to ground by line 384.

The (n+m)-bit digital output word of the converter in the special purpose code appears on lines 372 after the n+mth timing period. An output gating circuit 374 receives as input the signals on lines 372. The circuit 374 has a control terminal that receives the timing signal $T_{n+m+1}$. The output gating circuit 374, upon receipt of the timing signal $T_{n+m+1}$, will output the (n+m)-bit digital word in the special purpose code. The converter can be reset for a subsequent A/D conversion by resetting all of the latches 370. Accordingly, the inverse of the timing signal $T_{n+m+2}$ is applied to the reset terminals R of the latches 370 to reset them for a subsequent conversion.

B. Serial A/D Converters

Figure 13:
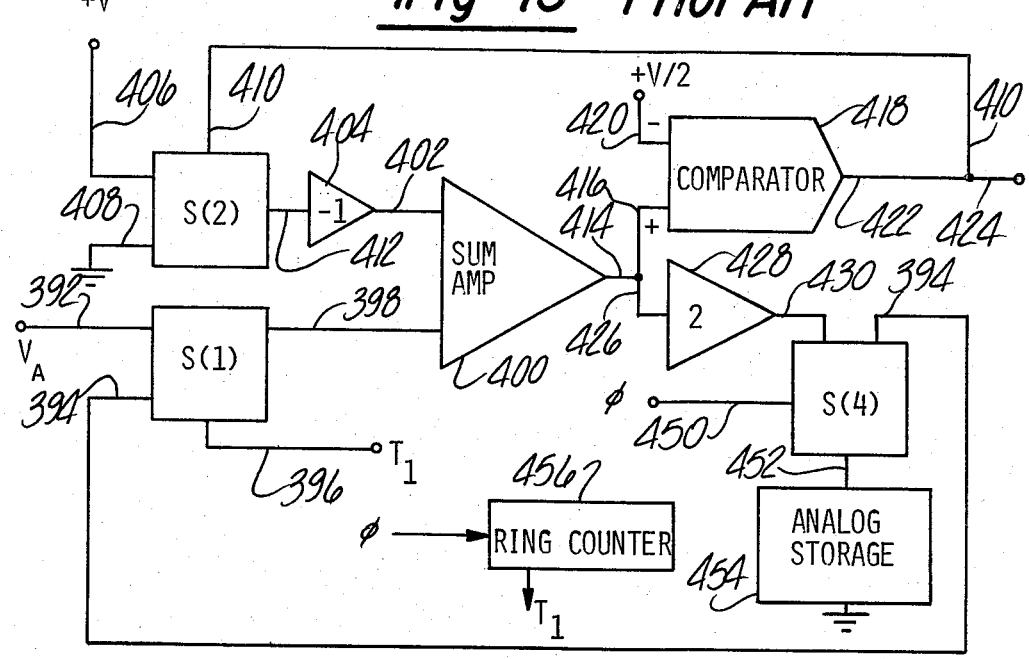
FIG. 13 is a schematic representation of a general serial analog-to-digital converter.
Figure 14:
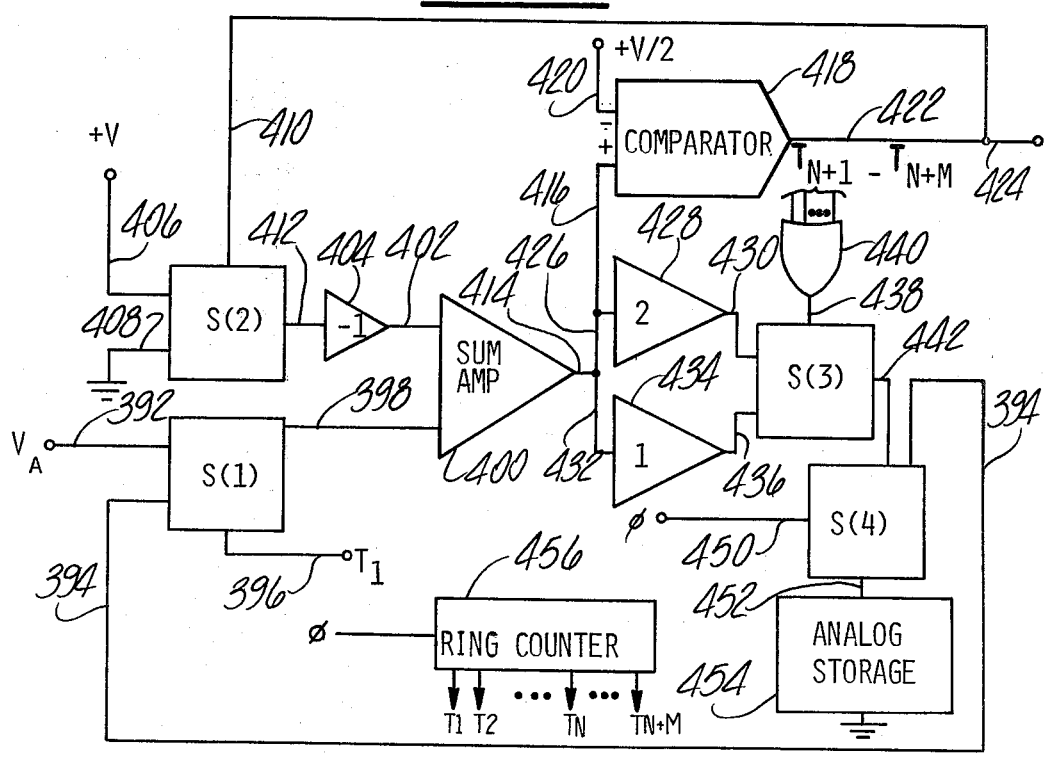
FIG. 14 is a schematic representation of a general serial analog-to-digital converter modified in accordance with the present invention.

Another general form of A/D converter that can be modified in accordance with the present invention to serve as the analog-to-special purpose digital converter 18 of the A/D conversion system of FIG. 1 is the serial A/D converter. FIG. 13 is a general, schematic model of the known forms of serial A/D converter. FIG. 14 is the general converter of FIG. 13 modified for use with the present invention. A brief description of the general, serial A/D converter of FIG. 13 is helpful as a basis for understanding the modified, serial A/D converter of FIG. 14.

With reference to FIG. 13, a serial-feedback A/D converter converts an analog input signal $V_A$ on line 392 into an equivalent n-bit binary digital word in the form of a series of digital bits appearing on output terminal 424. The serial-feedback A/D converter 390 includes a first switch S(1). The switch S(1) is a single pole-double throw switch with a control terminal 396 that receives the initial timing pulse $T_1$. The time pulses $T_1$, $T_2$, ... $T_n$ can be developed from a ring counter 456 as a function of a clock signal $\phi$.

When the timing signal $T_1$ is high, the switch S(1) connects line 392, which carries the analog input voltage $V_A$, with line 398. When the timing signal $T_1$ is low, i.e. at all other times than the initial timing period, switch S(1) connects line 394, which carries a feedback signal, with line 398.

A summing amplifier 400 receives as a first input the signal on line 398. The summing amplifier 400 has a second input from line 402 which is developed as the negative of the output signal of another switch S(2). The switch S(2) is a single pole-double throw analog switch having a control terminal 410 that carries a digital feedback signal. When the signal on control terminal 410 is high, line 406, which carries a reference voltage V, is connected to output line 412. When the feedback signal on control terminal 410 is low, the switch S(2) connects line 408, which is held at ground potential, to the output line 412. The signal on line 412 is applied to an amplifier 404 with a scale factor of negative one. The output signal from the amplifier 404 appears on line 402 as the negative of the signal on line 412.

The summing amplifier 400 produces a signal on line 414 that is the summation of the input signals on lines 398 and 402. In an alternative embodiment of the invention, the summing amplifier 400 and amplifier 404 could be replaced with a comparator or similar-type device that would produce a difference signal representing the difference between the signals on line 398 and line 412.

A comparator 418 has a first input terminal 416 that carries the difference signal as it branches off from line 414. The comparator 418 has a second, negative input terminal 420 that has applied to it one-half of the reference voltage V/2. When the magnitude of the signal on the first input terminal 416 equals or exceeds the magnitude of the signal on the second input terminal 420, the comparator 418 will produce a high digital signal on line 422. Conversely, when the magnitude of the signal on the second input terminal 420 exceeds the magnitude of the signal on the first input terminal 416, the comparator 418 will produce a low digital signal on line 422.

The digital signal appearing on line 422 is significant in two respects. First, it appears on output terminal 424 as the bit value for the corresponding clock period in the n-bit binary digital output word. Secondly, the digital signal on line 422 is applied on line 410 as the digital feedback signal to the switch S(2).

The difference signal that appears on line 414 as the output of the summing amplifier 400, is also applied on line 426 as the input signal to a scaling amplifier 428. Typically, the scale factor of the amplifier 428 will be two (2). Accordingly, the amplifier output signal appearing on line 430 has a magnitude twice that of the difference signal.

A switch S(4) receives as input the scaled amplified signal on line 430. The switch S(4) is a single pole-double throw analog switch having a control terminal 450. The control terminal 450 has applied to it the clock or periodic timing signal $\phi$. When the clock signal $\phi$ is high, the switch S(4) connects line 430, which carries the scaled difference signal to line 452, which is the input terminal to an analog storage device 454. The analog storage device is generally a capacitance and serves to store the signal carried on line 430. When the clock signal $\phi$ is low, the switch S(4) connects line 452 with line 394. This connection allows the analog storage device 454 to provide its stored signal information onto line 394 which provides the stored signal information to switch S(1) as the analog feedback signal.

The operation of the serial-feedback A/D converter 390 can best be understood by means of a procedural example. For purposes of analysis, it is assumed that n equal 4, $V_A$ equals 13, V equals 16 and V/2 equals 8, that the scale factor of the summing amplifier 400 is unity. The procedural execution is described as follows.

During the initial timing period when $T_1$ is high, the analog input voltage $V_A$ will be applied by switch S(1) to line 398. Initially, the digital feedback signal on line 410 will be low, and the signal value on line 412 and line 402 will be zero. Accordingly, the difference signal will have a value of 13 at the output of comparator 418. The value 13 on line 416 is greater than the value 8 on line 420, and, therefore, the comparator output signal on line 422 will be high. The first bit in the n-bit digital output word will be high, and the feedback signal on line 410 will be high. The difference signal is also applied to the scaling amplifier 428. The output of the scaling amplifier will have a value of 26, and likewise will the analog feedback signal on line 394.

During the second clock period, the signal on line 398 will have a value of 26, and the signal on line 402 will have a value of $-16$. Accordingly, the difference signal on line 414 will be 10. The signal on line 416 will have a value of 10 and the signal on line 420 will have a value of 8, and, therefore, the second bit in the n-bit digital output word will be high, as will the digital feedback signal on line 410. The difference signal will be scaled to a value of 20 by amplifier 428, and, therefore, the analog feedback signal on line 394 will be likewise valued.

During the third clock period, the signal on line 398 will have a value of 20, and the signal on line 402 will have a value of $-16$. Accordingly, the difference signal will have a value of 4. The signal on line 416 will have a value of 4, and the signal on line 420 will have a value of 8. Accordingly, the signal on line 422 will be low, causing the third bit in the n-bit digital output word to be low, as well as the digital feedback signal on line 410. The difference signal will be scaled by amplifier 428 to a value of 8, and the analog feedback signal on line 394 will be likewise valued.

During the fourth clock period, the signal value on line 398 will be 8, and the signal value on line 402 will be zero. Accordingly, the difference signal on line 414 will be 8. The signal value on line 416 will be 8, and the signal value on line 420 will be 8 and, therefore the digital signal on line 422 will be high. This will result in the fourth bit of the n-bit digital output signal being high. This sequence of four cycles has produced the correct n-bit digital equivalent signal, viz. 1101 is equivalent to 13 in binary digital code.

The simplest modified form of serial A/D converter is the same as FIG. 13 with one exception: scaling amplifier 428 has a scale factor K which is less than two, but more than one. The serial output 424 now includes m+n bits. K must be large enough that $K^{m+n}$ is greater than or equal to $2^n$.

FIG. 14 illustrates a modified serial-feedback A/D converter. The A/D converter of FIG. 14 incorporates the entire A/D converter of FIG. 13, and includes additional circuit elements to adapt it for use with the present invention. In view of the preceding detail description of the A/D converter of FIG. 13, only those added circuit elements that are pertinent to an understanding of the present invention will be described in the A/D converter of FIG. 14.

The difference signal which appears on line 414 as the output of the summing amplifier 400, is now branched off onto an additional signal path or line 432. A second scaling amplifier 434 receives as input the difference signal on line 432. The scaling amplifier 434 in the illustrated embodiment has a scale factor of unity, however, it is possible to select other scale factors less than two (2). When a scale factor of unity is selected, as in the present illustration, the second scaling amplifier 434 is synonymous with a direct connection of lines 432 and 436.

A switch S(3) is interposed between the outputs of the first and second scaling amplifiers 428 and 434 and the switch S(4). The switch S(3) is a single pole-double throw analog switch having a control terminal 438. The control terminal 438 receives the output of an OR gate 440 that has m input terminals. In the present embodiment, the m input terminals of the OR gate 440 have applied to them the timing signals $T_{n+1}-T_{n+m}$. The timing signals T can be developed from a ring counter 456 as a function of the clock signal $\phi$. During the clock or timing periods associated with the selected timing signals $T_{n+1}-T_{n+m}$, the output signal of the OR gate 440 on line 438 will be high. At all other times the signal on line 438 will be low.

When the signal on control terminal 438 is low, the switch S(3) will connect line 430, which carries the difference signal as scaled by amplifier 428, with line 442. When the signal on control terminal 430 is high, the switch S(3) will connect line 436, which carries the difference signal as scaled by amplifier 434. The line 442 supplies the scaled difference signal to switch S(4) in the manner hereinbefore described.

The selection of specific ones of the timing signals T is determinative of which bit positions in the (n+m)-bit digital output word will be repetitive of adjacent bit positions. In the present illustration, the selection of the final m timing signals as inputs to the OR gate 440 will cause the final m bits of the (n+m)-bit digital output word to be repetitive in weight with the nth bit. Other bits can be chosen to be repetitive as an input signal to the OR gate 440. Accordingly, the (n+m)-bit digital output word will be produced by the sequence of bit values appearing at terminal 424 of the A/D converter after n+m clock periods.

The serial-feedback A/D converter of FIG. 13 is general to several known species of serial-feedback A/D converters. Among such species of converters are the (1) single-amplifier circulation A/D converter; (2) dual-amplifier circulation A/D converter, and (3) charge equalizing A/D converter. All of the latter three converter types are described in their unmodified forms in the second of the earlier-referenced Schmid articles.

C. Cascade A/D Converters

Figure 15:
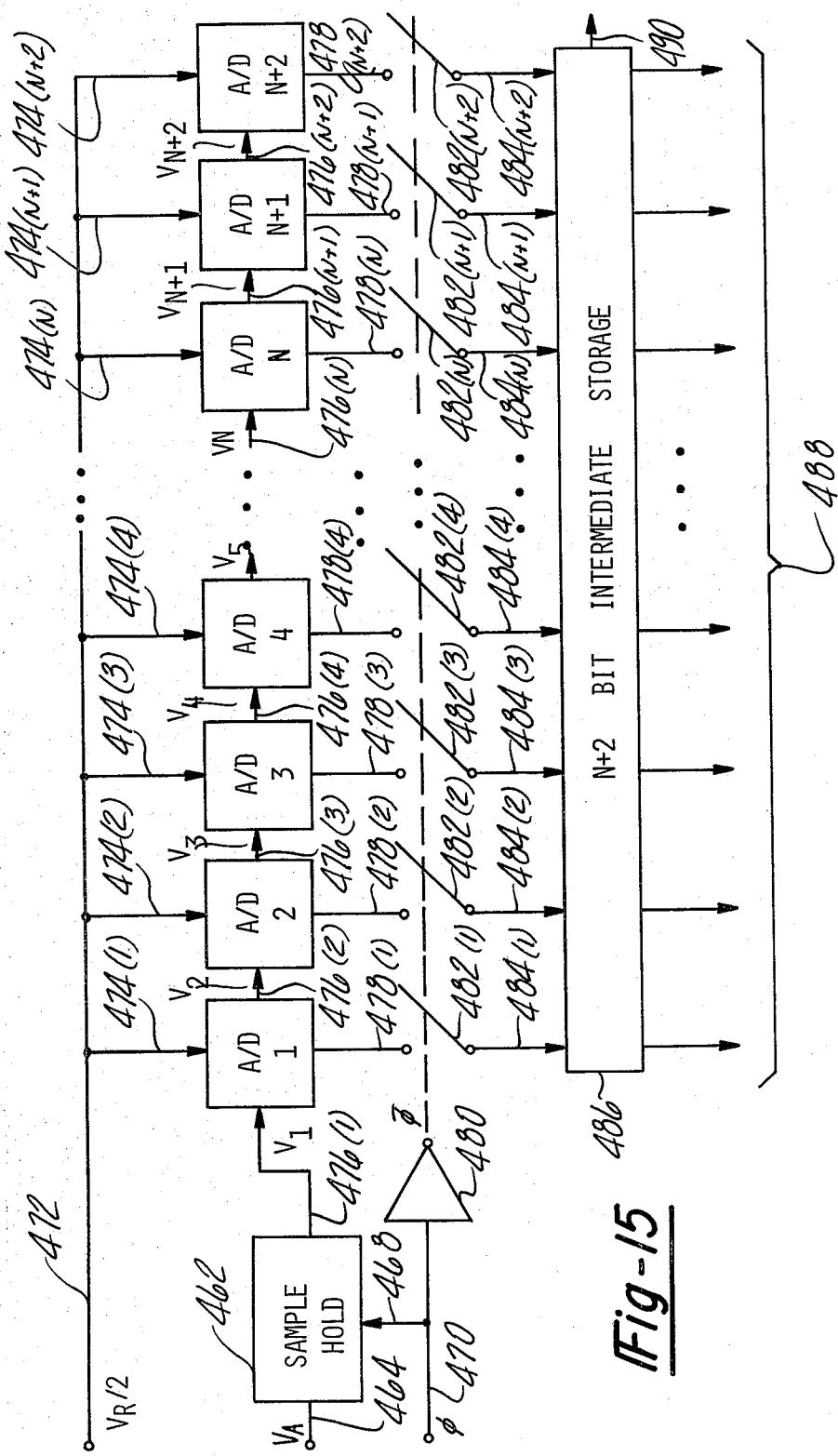
FIG. 15 is a schematic representation of a cascade-type analog-to-digital converter modified in accordance with the present invention.

FIG. 15 is a cascade type A/D converter, modified for use with the present invention. The A/D converter converts an analog input signal on line 464 into a corresponding (n+m)-bit digital output word in parallel form on lines 488, or in serial form on line 490.

The cascade-type A/D converter includes a sample hold circuit 462 that receives the analog input signal on line 464. The sample hold circuit 462 is controlled by the cock signal $\phi$, and receives the clock signal on line 468 which connects to clock line 470.

The cascade-type A/D converter also includes a plurality of single bit A/D conversion stages denoted A/D(1), A/D(2), ... A/D(N), ... A/D(n+m). There is one single bit A/D conversion stage for each bit in the (n+m)-bit digital output word.

The terminal connections for each of the n+m stages can be exemplified by the description of the first conversion stage A/D(1). The first conversion stage receives a like enumerated analog input voltage $V_1$ on line 476(1), which in this instance is equal to the analog input signal $V_A$. A reference voltage $V_R/2$ on line 472 is taken off by line 474(1) and applied to the conversion stage A/D(1). The bit value corresponding to the conversion stage is output on line 478(1). Another output line 476(2) carries the analog input signal $V_2$ to the next adjacent single-bit conversion stage.

In overview, the cascade-type A/D converter operates as follows. At the first single bit conversion stage A/D(1) the analog input signal $V_1$ is compared against the reference signal $V_R/2$ to determine if the first bit position is to be a binary 1 or 0. If the analog input signal $V_1$ exceeds $V_R/2$, it indicates that the bit value for this position is 1. Conversely, if $V_R/2$ exceeds $V_1$, it indicates that the bit value for this position is 0. In a normal binary form of cascade-type A/D converter, if the bit value is 1, then the reference signal $V_R/2$ is subtracted from the analog input signal and the difference is multiplied by two to provide the analog input signal for the next adjacent single bit conversion stage.

FIG. 16 illustrates the internal construction of a single bit conversion stage of FIG. 15 that obeys the normal binary form. There are n single bit conversion stages of the type illustrated in FIG. 16 in the cascade-type A/D converter of FIG. 15.

More specifically, an examplary single bit binary conversion stage A/D(i) is described as follows. The analog input voltage $V_1$ from the preceding single bit conversion stage is received on line 476(i). The reference voltage $V_R/2$ is received on line 474(i). A comparator 496 has a positive input terminal 492 that receives the analog input voltage $V_i$, and a negative input terminal 494 that receives the reference voltage $V_R/2$. The comparator 496 produces a digital output signal having a value depending upon the relative magnitudes of its input signals. Specifically, if the signal value on input terminal 492 exceeds the signal value on input terminal 494, the digital output of the comparator will be high and a binary one will appear on line 478(i). Conversely, if the signal value on input terminal 494 exceeds the signal value on input terminal 492, then the digital output of comparator 496 will be low and a binary 0 will appear on line 478(i).

A single pole-single throw switch has a contact 498 controlled by the digital output of the comparator 496. When the comparator output is high, the contact 498 couples line 500, which carries the reference voltage $V_R/2$, with line 502, which is the negative input terminal of a summing circuit 504. When the digital output of the comparator 496 is low, the contact 498 remains open.

The summing circuit 504 also receives at its positive input the analog input voltage $V_i$ on line 476(i). The summing circuit 504 outputs a signal on line 506 that is the differnce between the signal values supplied to its positive and negative inputs.

A scaling amplifier 508 receives the signal on line 506 and produces an output signal on line 476(i) that is twice the input signal. This signal then functions as the analog input signal $V_{i+1}$ for the adjacent single bit conversion stage A/D(i+1).

In accordance with the present invention, m single bit conversion stages may be modified slightly to produce bits that are repetitive in weight with the bits of at least one of the other n stages. In the cascade-type A/D converter of FIG. 15, m is equal to 2, and the final two bits are chosen to be repetitive of the nth bit. The final two conversion stages A/D(N+1) and A/D(N+2) incorporate the modified internal construction of FIG. 17.

FIG. 17 illustrates conversion stage A/D (n+i) and is modified slightly from the conversion stage of FIG. 16. More specifically, the scaling amplifier 508' has a different scaling factor. In this case, the different scale factor is unity, although other scale factors less than 2 are possible. In fact, the use of an amplifier 508' with a scale factor of unity is synonymous with a direct connection of lines 506 and 476(n+i+1).

Referring again to FIG. 15, each of the single bit conversion stages performs the single bit conversion for its bit position during the first portion of the clock period. During the second portion of the clock period, the bit values appearing on the lines 478 are loaded into an N+2 bit intermediate storage buffer 486 through the closing of a plurality of switches. More specifically, each single bit conversion stage has associated with it a single pole-single throw switch. The contact 482 of the switch is controlled by the output signal from a clock inverter 480. The inverter 480 receives the clock signal $\phi$ on line 470 and inverts it. The output of inverter 480 is low during the first portion of the clock period when $\phi$ is high, and high during the second portion of the clock period when $\phi$ is low. When the inverse of $\phi$ is high, the switch contact 482 closes and connects each line 478 with a corresponding line 484. The closure of the switch causes the bit value on line 478 to be loaded into a corresponding stage of the N+2 bit intermediate storage buffer 486. The (n+m)-bit digital output word in the special purpose code can be obtained in parallel form on lines 488, or in serial form on line 490.

The above-described cascade-type A/D converter is described in its unmodified form in the third of the earlier-referenced Schmid articles.

V. PROCESSOR IMPLEMENTED SYSTEMS

FIG. 19 is a processor-implemented A/D conversion system patterned after the A/D conversion system of FIG. 1. The A/D conversion system is controlled by a central processor unit (CPU) 522 that may take the form of a commercially available micro-processor or mini-computer. Information is communicated between the CPU 522 and units under the control of the CPU through three busses: a control bus 524C; an address bus 524A; and a data bus 524B. This is in accordance with usual computer system architecture.

The analog input signal that is to be converted to binary digital form is received on line 528. The signal is applied to an analog-to-digital converter 526 that may be any one of the types hereinbefore discussed as suitable for use with the present invention. The output signal of the A/D converter 526 is the (n+m)-bit digital word in the special purpose code. A buffer unit 530 under the control of the CPU 522 provides temporary storage for the (n+m)-bit digital word.

The (n+m)-bit digital word in the special purpose code is translated into the corresponding n-bit digital word in the binary digital code by means of a look-up table stored in a programmable read-only-memory (PROM) 532. The CPU 522 uses the (n+m)-bit digital word as an address for the corresponding n-bit word in binary digital code. Once the n-bit binary digital word is accessed, it is sent out by the CPU to an output port 534. The desired n-bit word in binary digital code appears on the output cable 536 of port 534.

One method of obtaining the binary digital code word is to store the difference between the (n+m)-bit code word corresponding to the n-bit word and the n-bit word. This difference is then subtracted from the (n+m)-bit word to obtain the corresponding n-bit word.

Another method of obtaining the binary digital code word is to partition the memory PROM 532 into two separate look-up tables; one for each half of the (n+m)bit access word. Each half of the (n+m)-bit digital word is then used to access an n-bit digital word, which is the correct n-bit word if the other half of the (n+m)-bit digital word were all zero. These two n-bit digital words are added to obtain the correct n-bit word corresponding to the complete (n+m)-bit digital word. This affords a great savings in memory space relative to a look-up table containing all $2^{n+m}$ permutations of the n+m-bit word. Alternately, each table entry may have an (n+p)-bit word, where p is one (1) or more; this will provide more accuracy in the translation. This method could be extended to any number of separate look-up tables, each accessed using part of the (n+m)-bit digital word. In the limit, there would be n+m tables, each with 2 entries; indeed, one entry in each table may always be zero and not actually stored. The correct n-bit word would be obtained by adding all n+m of the (n+p)-bit word obtained from the tables.

FIG. 20 illustrates a processor-implemented D/A conversion system that is patterned after the D/A converter system of FIG. 2. The D/A converter system converts an n-bit binary digital signal on cable 548 into an equivalent analog signal on line 556.

The D/A conversion system includes a central processor unit (CPU) 542. Information is communicated between the CPU 542 and the devices under its control by a group of busses: a control bus 544C; an address bus 544A; and a data bus 544D.

A buffer unit 546 receives the n-bit binary digital signal on cable 548 and provides temporary storage for it.

The n-bit binary digital signal is translated into a corresponding (n+m)-bit digital word in a special purpose code by means of a look-up-table contained in a programmable read-only-memory (PROM) 549. The n-bit binary digital word is used as an address for the corresponding (n+m)-bit binary digital word stored in the PROM 549. The alternate methods associated with the previously discussed (n+m)-bit to n-bit translation can be applied in analogous fashion to the presently discussed n-bit to (n+m)-bit conversion.

A digital-to-analog converter 550 which may be any one of the types hereinbefore discussed as useful with the present invention is under the control of the CPU 542. The D/A converter 550 converts the (n+m)-bit digital word into the equivalent analog signal and outputs it on line 552.

An actuator 554 receives the equivalent analog signal on line 552 and outputs an amplified or otherwise modified form of the analog signal on line 556 to an analog device.

VI. CALIBRATION METHODS

A number of methods have been developed for calibrating an A/D converter modified in accordance with the present invention, to establish the relation between the special purpose code unique to each converter and the normal binary digital code. Three of these methods are illustrated in flowcharts of FIGS. 21, 22 and 23. A description of each method is provided as follows.

Figure 21:
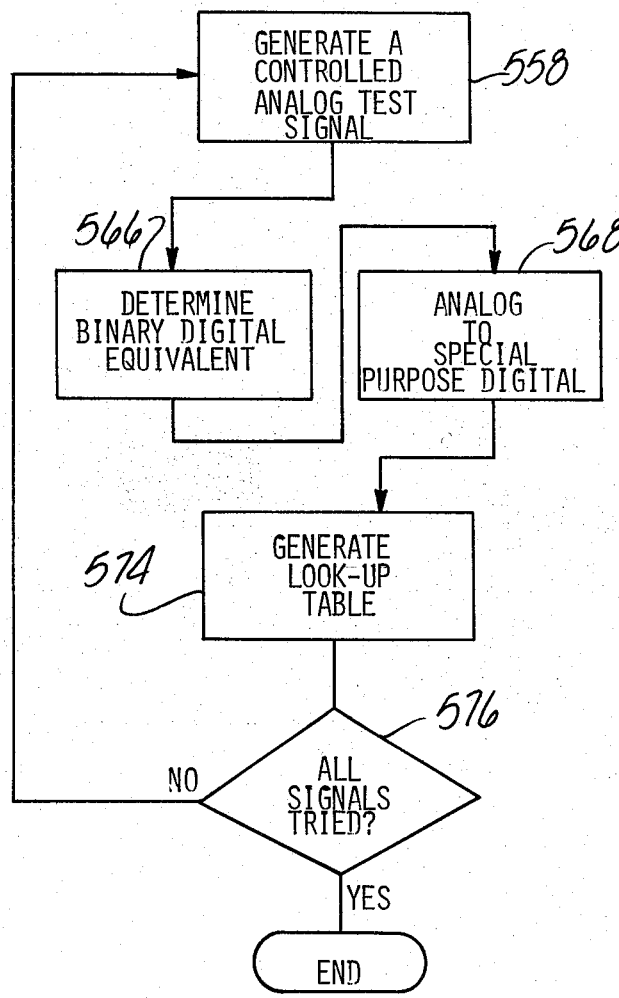
FIGS. 21, 22 and 23 are flow charts illustrating respective first, second and third methods for calibrating an analog-to-digital conversion device of the present invention.

FIG. 21 illustrates a first method for calibrating an A/D converter of the present invention. In step 558, a test analog signal is generated.

In step 566, an equivalent n-bit binary digital word is analytically determined for the known value of the test signal. Alternatively, a highly accurate n-bit A/D converter can be used for the same purpose.

In step 568, the test analog signal is applied to an A/D converter modified for use with the present invention. The output of the converter is an (n+m)-bit digital word in the special purpose code uniquely associated with that converter.

In step 574, the n-bit word resulting from step 566 and the (n+m)-bit word rsulting from step 568 are used as a table entry and a table address, respectively, to generate an entry in the look-up table for translating digital words.

In decision 576, a check is made whether all analog signals have been tried. If yes, the calibration is complete, and the YES path is followed to terminal 578. If not, the NO path is followed back to step 558, where a new analog test signal having a closely-controlled value is generated. This new test signal is changed in magnitude from the preceding test signal by an amount equal to the value of the nth bit in the n-bit binary digital word. The cycle is then repeated a plurality of times until a complete set of analog signal values has been generated and the conversion from each possible (n+m)-bit word to the corresponding n-bit word has been established.

Figure 22:
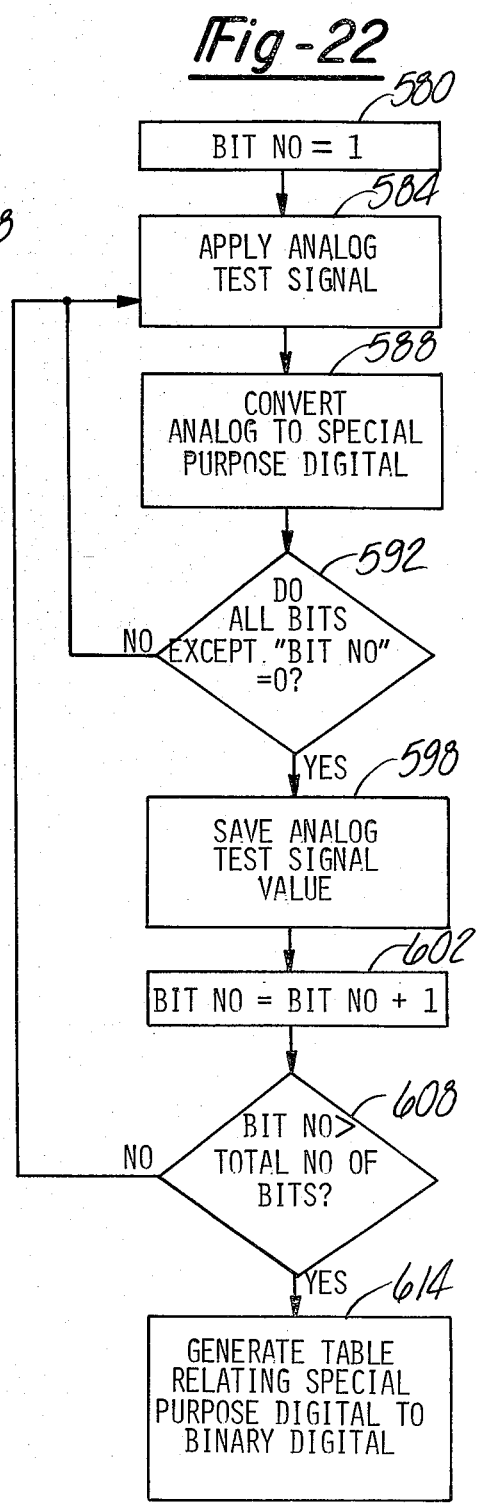

FIG. 22 is a flowchart illustrating another method of calibrating an A/D converter of the type suitable for use with the present invention. In general, the approach is to adjust an analog signal applied to the converter until exactly one bit of the (n+m)-bit digital output word is equal to one (1). The analog value giving rise to this output is then recorded and the bit position having the single binary one (1) is weighted in proportion to that analog value.

In step 580, a count variable designated BIT NO is set to one (1). The flow then enters an iterative loop at step 584. In step 584 an analog test signal is applied to the A/D converter. In step 588 the analog test signal is converted to the corresponding (n+m)-bit digital word in the special purpose code, using the converter being calibrated.

In decision 592, the (n+m)-bit digital word is tested to determine if all bit positions except the bit position represented by BIT NO are equal to 0. If no, the NO path is followed back to step 584 where the analog test signal is adjusted. If any bit higher than the desired bit is one (1), the analog test signal is reduced. If the desired bit and all higher bits are 0, the analog test signal is increased. If the desired bit is one (1), all higher bits are 0, and any lower bit is one (1), then the analog test signal is reduced. After adjusting the analog test signal, steps 584 and 588 are repeated until decision 592 is satisfied.

When decision 592 is satisfied, the YES branch is followed to step 598. In step 598 the analog test signal value that satisfied decision 592 for this BIT NO is saved. In step 602 BIT NO is set equal to BIT NO+1 preparatory to repeating the loop.

In decision 608, the count variable BIT NO is tested against the total number of bits, i.e. n+m. If BIT NO is less than or equal to n+m, the NO path from decision 608 is followed to step 584. Steps 584 through 598 are then repeated until each bit position is assigned a weight in terms of an analog signal value.

When decision 608 is satisfied, the YES branch is followed to step 614. In step 614 a look-up-table is generated for converting the (n+m)-bit special purpose digital code into the n-bit binary digital code, based on the previously determined signal values of the bits in the (n+m)-bit special purpose digital code. For each possible (n+m)-bit digital code, the sum of the analog signal values corresponding to one (1) bits in the code is calculated. The n-bit binary code corresponding to this analog sum is then determined and inserted in the table.

Figure 23:
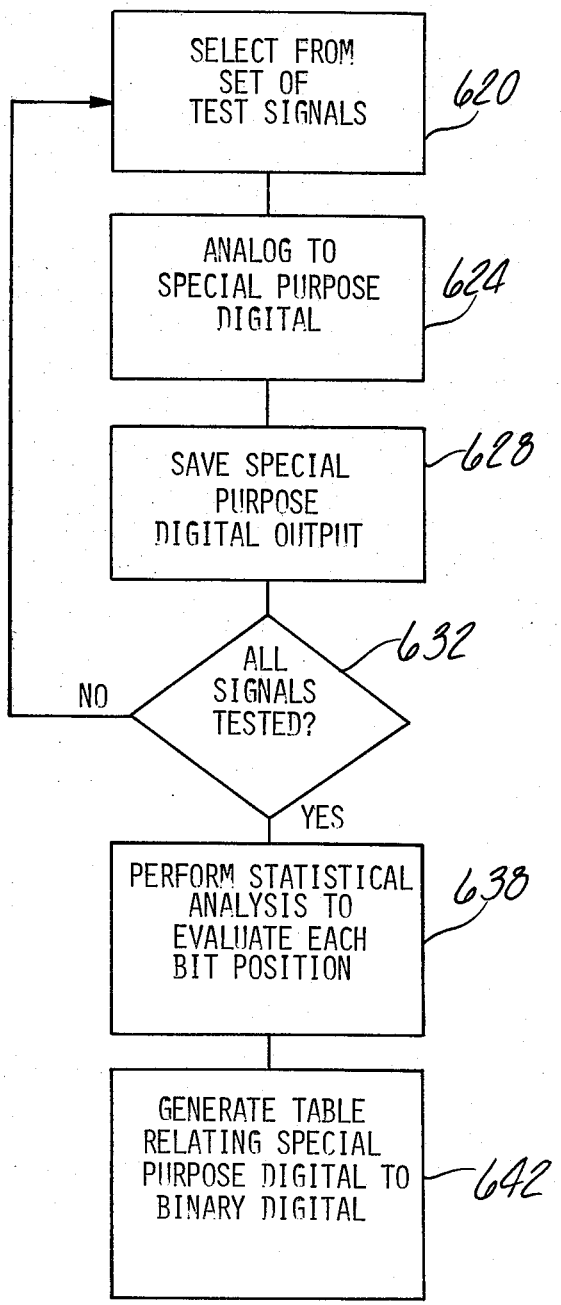

FIG. 23 is a flowchart illustrating another method for calibrating an A/D converter of the type suitable for use with the present invention. In overview, the method calls for the use of a predetermined sample of analog test signal values to generate corresponding (n+m)-bit digital words in the special purpose code. The number of sample analog signals is significantly less than $2^n$, i.e. the number of all possible distinct test signals. The results of the sample conversions are then statistically analyzed to develop the conversion between the special purpose code and the binary digital code.

In step 620, an analog test signal value is selected from a statistical sample of such analog test signal values. In step 624, the selected analog test signal is applied to the A/D converter being calibrated to produce an (n+m)-bit word in the special purpose digital code. In step 628 the resulting (n+m)-bit digital word for this test analog value is saved.

In decision 632, the question is asked if all analog test signals from the statistical sample have been tested. If no, the NO path is followed back to step 620, and the routine is repeated until all of the samples have been tested.

If decision 632 has been satisfied, the YES path is followed to step 638. In step 638 a statistical analysis is performed on the stored (n+m)-bit digital words in the special purpose code to determine the analog value of each bit position in the special purpose (n+m)-bit code. For example, the bit values can be found by a least-squares fitting technique as is taught in F. B. Hildebrand, *Introduction to Numerical Analysis*, Chapter 7, McGraw Hill, 1956. A linear combination of binary-valued functions is least-squares fitted to the measured analog values. The binary-valued functions are the bits of the (n+m)-bit digital word. The linear combining coefficients are the analog values of bits being determined. This technique will tend to average out small random measurement and converter errors, and thus produce more accurate results.

In step 642, a look-up-table is generated converting the special purpose digital code to the binary digital code based on the results of the statistical analysis of step 638. This generation is the same as step 614 of FIG. 22.

The calibration processes described in connection with the calibration of an A/D converter of the present invention can be made to apply in analogous fashion to the calibration of a D/A converter of the present invention.

The preferred form of D/A calibration is directly analogous to the single bit adjustment method illustrated in FIG. 22 and described in connection therewith. In the case of D/A calibration the method involves the following steps.

Initially, an (n+m)-bit digital word having zeroes in all but a single bit position is applied as an input signal to a D/A converter of the present invention. This yields an analog output signal of a value that represents the weight of the non-zero bit position of the input word.

This analog value is then applied to an accurate n-bit A/D converter to translate it into an n-bit output word. The resulting n-bit output word, which is the n-bit image of the (n+m)-bit input word, is saved. Alternately, this accurate A/D converter may have n+p bits, where p is one (1), two (2), or more; this will provide more accuracy in the calibration.

Another distinct (n+m)-bit digital word having zeroes in all but one bit position is selected. The sequence iterates, beginning with the initial step.

When all possible distinct n+m digital input words have been applied, a look-up table is generated on the basis of the information relating each bit position of the (n+m)-bit digital code to a corresponding n-bit digital word. The look-up table may be partitioned into two parts to conserve memory space as was hereinbefore described under the part headed "Processor Implemented Systems".

If an A/D or D/A conversion system incorporating the present invention is to be implemented on a large scale integrated circuit, then it is not unreasonably burdensome to perform the calibration techniques illustrated in FIGS. 21, 22 or 23 for each LSI circuit produced. In fact, each circuit fabricated by LSI techniques is normally extensively tested by automated test methods. It would be possible to include the previously-described calibration techniques in the normal testing procedure.

VII. EPILOGUE

The foregoing has provided exemplary embodiments of the invention in forms that are readily achievable by modification of known converter types. However, as hereinbefore stated in the Disclosure of the Invention, the invention can be taken to a more general level where the only limitation on the special purpose code is that every analog value in the range represented by the normal n-bit code can also be accurately represented by the special purpose (n+m)-bit code. Specific embodiments of the invention, other than those hereinbefore described, but within the full and proper scope of the invention, will suggest themselves to those having skill in the art. Many modifications and variations in the present invention are possible in light of the above teachings. It is, therefore, to be understood that within the scope of the appended claims, the invention may be practiced otherwise than as specifically described.

The embodiments of the invention in which an exclusive property or privilege is claimed are defined as follows:

1. A device for converting an n-bit digital word to an equivalent analog signal comprising:
    addressable storage array means for outputting a special purpose (n+m)-bit digital word in response to a received n-bit digital word, said addressable storage array means storing a special purpose (n+m)-bit digital word corresponding to each received n-bit digital word, where the weight of each n-bit in said (n+m)-bit digital word is dependent upon its bit position and the weight of the bit positions are related to one another in accordance with a predetermined ratio and the m-bits are equal to one another and repetitive of selected lower order n-bits of the (n+m)-bit digital word; and
    (n+m)-bit digital-to-analog converter means having stable but imprecise component values for generating an analog signal in response to the (n+m)-bit digital word output from said storage array means, said analog signal having a value equivalent to the value of said received n-bit digital word and where said n and m bits of said (n+m)-bit digital words stored in said storage array means are selected to correct the generated analog signal for said imprecise component values.

2. The signal conversion device as defined in claim 1, wherein the n-bit digital word is a binary digital word having each n-bit position related to a next lower order bit position by a factor of two.

3. The signal conversion method as defined in claim 1, wherein the (n+m)-bit special purpose word has n bits comparably weighted with the n bits of the n-bit digital word code.

4. The signal conversion method as defined in claim 1, wherein each n bit of the (n+m)-bit word is related to the next lower order bit position by a factor less than two (2), but greater than one (1).

5. The signal conversion device as defined in claim 1 wherein the addressable storage array means includes:
a plurality of look-up tables, each look-up table having address locations associated with a different subset of the n bits in the n-bit digital word;
each address location in each look-up table is defined in terms of a unique code for the corresponding subset of n-bits,
each address location of each look-up table contains a subset of the (n+m)-bit digital word corresponding to the subset of n-bits used in its address; and
means for combining the subsets of the (n+m)-bit words obtained from the plurality of look-up tables to obtain the complete (n+m)-bit digital word corresponding to the n-bit digital word.

6. The conversion device as defined in claim 1 wherein the (n+m)-bit digital word is provided to the converter means in parallel form, and means is further defined to include,
a conversion network comprising a plurality of conversion stages equal in number to the n+m bits, each stage being associated with one of the bit positions and receiving the bit signal value for that position, and outputting a signal scaled proportional to the weight of its associated bit position and the bit signal value, and
summing means, receiving as signal input the signals from the plurality of conversion stages, for summing the scaled signals to produce the equivalent analog signal.

7. The signal conversion device as defined in claim 3, wherein the m bits of the (n+m)-bit word are repetitive of the lowest order n bit of the (n+m)-bit word.

8. The signal conversion device as alternatively defined in claim 1 or claim 5 wherein the addressable storage array means comprises at least one programmable read-only-memory (PROM).

9. The conversion device as defined in claim 6, wherein each of the plurality of conversion stages includes,
switch means, responsive to the signal value of the bit associated with that stage, for enabling the stage to output a signal if the bit value is of a first character, and disabling the stage from outputting the signal if the bit value is of a second character.

10. The conversion device as defined in claim 6, wherein each of the plurality of conversion stages includes scaler means for scaling the bit value associated with that stage to an analog signal having a value in proportion to the weight of the bit position.

11. The conversion device as defined in claim 10, wherein the conversion network comprises a resistor-ladder network.

12. The conversion device as defined in claim 10, wherein the scaler means includes a resistance having an ohmic value proportioned to the weight of the respective bit positions.

13. The conversion device as defined in claim 6, wherein the summing device comprises an operational amplifier.

14. The conversion device as defined in claim 12, wherein the conversion network comprises a weighted-resistor network.

15. A method for accurately converting a n-bit digital word to an equivalent analog signal using a (n+m)-bit digital-to-analog converter having stable but imprecise component values comprising the steps of:
storing in an addressable storage array a plurality of special purpose (n+m)-bit digital words, each special purpose (n+m)-bit digital word corresponding to one n-bit digital word and having an analog equivalent of the corresponding n-bit word when converted to analog form by the (n+m)-bit digital-to-analog converter, and where the weight of each n-bit in the (n+m) bit digital word is dependent on its bit position and the weights of the n-bit positions are related to one another with a predetermined ratio 2 greater than 1 and the weights of the m-bits of the (n+m)-bit digital word are equal to one another and repetitive of selected lower order n-bits, both the n and m-bits are selected to correct for the imprecise component values of the (n+m)-bit digital-to-analog converter;
addressing said addressable storage array with a received n-bit digital word to output the corresponding (n+m)-bit digital word; and
converting said corresponding (n+m)-bit digital word output from the storage array in the (n+m)-bit digital-to-analog converter to generate an analog signal equivalent to the value of the received n-bit digital word.

16. The signal conversion method as defined in claim 15, wherein the n-bit digital word is a binary digital word having each bit position related to the next lower order bit position by a factor of two.

17. The signal conversion method as defined in claim 15, wherein the (n+m)-bit special purpose code has n bits comparably weighted with the n bits of the n-bit digital word.

18. The signal conversion method as defined in claim 15 wherein each n-bit of the (n+m)-bit word is related to the next lower order bit position by a factor less than two (2), but greater than one (1).

19. The signal conversion method as defined in claim 17, wherein the m bits of the (n+m)-bit word are repetitive of selected low order bits of the n bits.

20. The signal conversion method as defined in claim 17, wherein the m bits of the (n+m)-bit word are repetitive of the lowest order bit of the n bits.

* * * * *